(12) United States Patent
Jung et al.

(10) Patent No.: US 12,721,233 B2
(45) Date of Patent: Aug. 25, 2026

(54) STACKED SEMICONDUCTOR PACKAGE

(71) Applicant: SAMSUNG ELECTRONICS CO., LTD., Suwon-si (KR)

(72) Inventors: Dawoon Jung, Suwon-si (KR); Seungduk Baek, Suwon-si (KR); Donghun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 367 days.

(21) Appl. No.: 18/533,800

(22) Filed: Dec. 8, 2023

(65) Prior Publication Data

US 2024/0194648 A1 Jun. 13, 2024

(30) Foreign Application Priority Data

Dec. 8, 2022 (KR) ........................ 10-2022-0170256

(51) Int. Cl.

*H10B 80/00* (2026.01)
*H10W 90/00* (2026.01)
*H10W 74/15* (2026.01)
*H10W 90/20* (2026.01)

(52) U.S. Cl.

CPC ............ *H10W 90/00* (2026.01); *H10B 80/00* (2023.02); *H10W 74/15* (2026.01); *H10W 90/20* (2026.01);

(Continued)

(58) Field of Classification Search

CPC .. H10B 80/00; H10W 72/0198; H10W 72/20; H10W 72/30; H10W 72/851;

(Continued)

(56) References Cited

U.S. PATENT DOCUMENTS 8,395,259 B2 * 3/2013 Eun ........................ H10W 90/00 257/737
9,236,351 B2 * 1/2016 Jang ........................ H10P 54/00

(Continued)

FOREIGN PATENT DOCUMENTS

JP 4086068 8/2016
KR 10-2011-0128768 A 11/2011

(Continued)

OTHER PUBLICATIONS

Office Action dated Jun. 17, 2026 issued in corresponding to Korean Patent Application No. 10-2022-0170256.

*Primary Examiner* — Jaehwan Oh
(74) *Attorney, Agent, or Firm* — Morgan, Lewis & Bockius LLP

(57) ABSTRACT

A semiconductor package includes a base structure and a plurality of semiconductor chips disposed on the base structure. Each of the plurality of semiconductor chips has a chip region. The plurality of semiconductor chips are stacked in a vertical direction such that chip regions at least partially overlap each other. In the stack of the plurality of semiconductor chips, each of the plurality of semiconductor chips has a first width in a first direction and a second width in a second direction. The plurality of semiconductor chips include a first semiconductor chip and a second semiconductor chip, having scribe regions on opposite sides of each of the chip regions. A first width of the first semiconductor chip is greater than a first width of the second semiconductor chip.

20 Claims, 15 Drawing Sheets

(52) U.S. Cl.
CPC ........ *H10W 90/297* (2026.01); *H10W 90/722* (2026.01); *H10W 90/724* (2026.01); *H10W 90/732* (2026.01); *H10W 90/734* (2026.01); *H10W 90/792* (2026.01); *H10W 90/794* (2026.01)

(58) Field of Classification Search
CPC ..... H10W 72/90; H10W 74/15; H10W 90/00; H10W 90/20; H10W 90/291; H10W 90/297; H10W 90/722; H10W 90/724; H10W 90/732; H10W 90/734; H10W 90/792; H10W 90/794; H10W 99/00
See application file for complete search history.

(56) References Cited

U.S. PATENT DOCUMENTS 9,397,034 B2 * 7/2016 Eun ....................... H10W 90/00
10,090,278 B2 * 10/2018 Park .................... H10W 74/117
2003/0180987 A1 * 9/2003 Milla ...................... H10P 72/74 257/E21.705
2007/0007639 A1 * 1/2007 Fukazawa ............. H10W 90/00 438/109
2011/0272692 A1 * 11/2011 Han ...................... H10W 20/20 257/E23.179
2014/0361441 A1 * 12/2014 Bae ..................... H10W 70/093 257/777
2021/0091045 A1 * 3/2021 Heo ...................... H10W 90/00
2021/0398947 A1 * 12/2021 Shin ...................... H10W 90/00
2022/0013418 A1 * 1/2022 Seo ....................... H10P 74/273
2024/0014175 A1 * 1/2024 Seo ....................... H10W 46/00

FOREIGN PATENT DOCUMENTS

KR 10-2147354 B1 8/2020
KR 10-2021-0031046 A 3/2021

* cited by examiner

STACKED SEMICONDUCTOR PACKAGE

CROSS-REFERENCE TO RELATED APPLICATION(S)

This application claims priority to Korean Patent Application No. 10-2022-0170256 filed on Dec. 8, 2022 in the Korean Intellectual Property Office, the disclosure of which is herein incorporated by reference in its entirety.

TECHNICAL FIELD

The present disclosure relates to semiconductors and, more specifically, to a stacked semiconductor package.

DISCUSSION OF THE RELATED ART

In accordance with the development of the electronic industry and the needs of users, electronic devices are becoming more compact and lightweight, and semiconductor packages used in the electronic devices are expected to have higher performance and larger capacity along with being smaller and lighter weight. One approach for achieving higher performance and larger capacity along with miniaturization and light weight is to use through silicon vias (TSVs) and semiconductor packages in which multiple semiconductor chips are stacked.

SUMMARY

A semiconductor package includes a base structure. A plurality of semiconductor chips are disposed on a portion of an upper surface of the base structure. Each of the plurality of semiconductor chips has a chip region and a plurality of through-electrodes disposed in the chip region. The plurality of semiconductor chips are stacked in a vertical direction such that the chip regions least partially overlap each other. In the stack of the plurality of semiconductor chips, each of the plurality of semiconductor chips has a first width in a first direction and a second width in a second direction that is perpendicular to the first direction. The plurality of semiconductor chips include a first semiconductor chip and a second semiconductor chip, having scribe regions disposed on different sides of each of the chip regions. A first width of the first semiconductor chip is greater than a first width of the second semiconductor chip, and a second width of the first semiconductor chip is equal to or smaller than a second width of the second semiconductor chip.

A semiconductor package includes a base structure. A plurality of semiconductor chips are disposed on a portion of an upper surface of the base structure. Each of the plurality of semiconductor chips has a chip region, and a plurality of through-electrodes disposed in the chip region. The plurality of semiconductor chips are stacked in a vertical direction such that the chip regions least partially overlap each other, and each of the chip regions has a first side and a second side, spaced apart from each other in a first direction, and a third side and a fourth side, spaced apart from each other a second direction that is perpendicular to the first direction. The plurality of semiconductor chips include a first semiconductor chip without a scribe region proximate to the chip region thereof, a second semiconductor chip having a first scribe region and a second scribe region, respectively disposed on the first and second sides of the chip region thereof, a third semiconductor chip having a third scribe region and a fourth scribe region, respectively disposed on the third and fourth sides of the chip region thereof, and a fourth semiconductor chip having a scribe region at least partially surrounding the first to fourth sides of the chip region thereof.

A semiconductor package includes a lower semiconductor chip and a plurality of upper semiconductor chips stacked on a portion of an upper surface of the lower semiconductor chip in a vertical direction. Each of the plurality of semiconductor chips has a chip region and through-vias disposed in the chip region. The plurality of upper semiconductor chips are stacked in the vertical direction such that the chip regions least partially overlap each other. In the stack of the plurality of upper semiconductor chips, each of the plurality of upper semiconductor chips has a first width in a first direction, and a second width in a second direction that is perpendicular to the first direction. The plurality of semiconductor chips include a first semiconductor chip and a second semiconductor chip having scribe regions located on opposite sides, among sides of each of the chip regions. A first width of the first semiconductor chip is greater than a first width of the second semiconductor chip, and a second width of the first semiconductor chip is equal to or smaller than a second width of the second semiconductor chip.

BRIEF DESCRIPTION OF DRAWINGS

The above and other aspects and features of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1A:
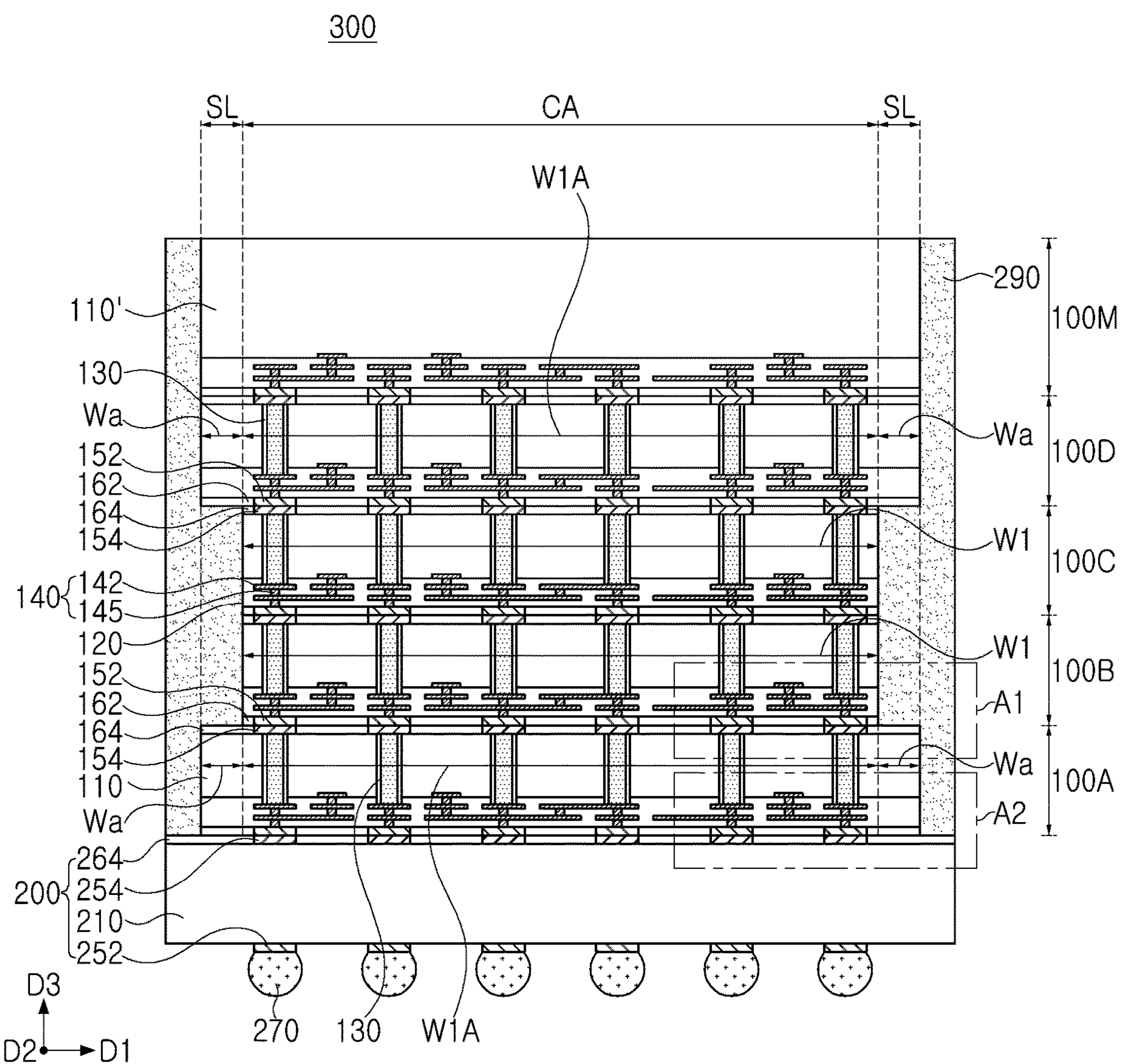
FIGS. 1A and 1B are cross-sectional views of a semiconductor package according to an embodiment of the present disclosure, cut in a first direction D1 and a second direction D2, respectively.
Figure 1B:
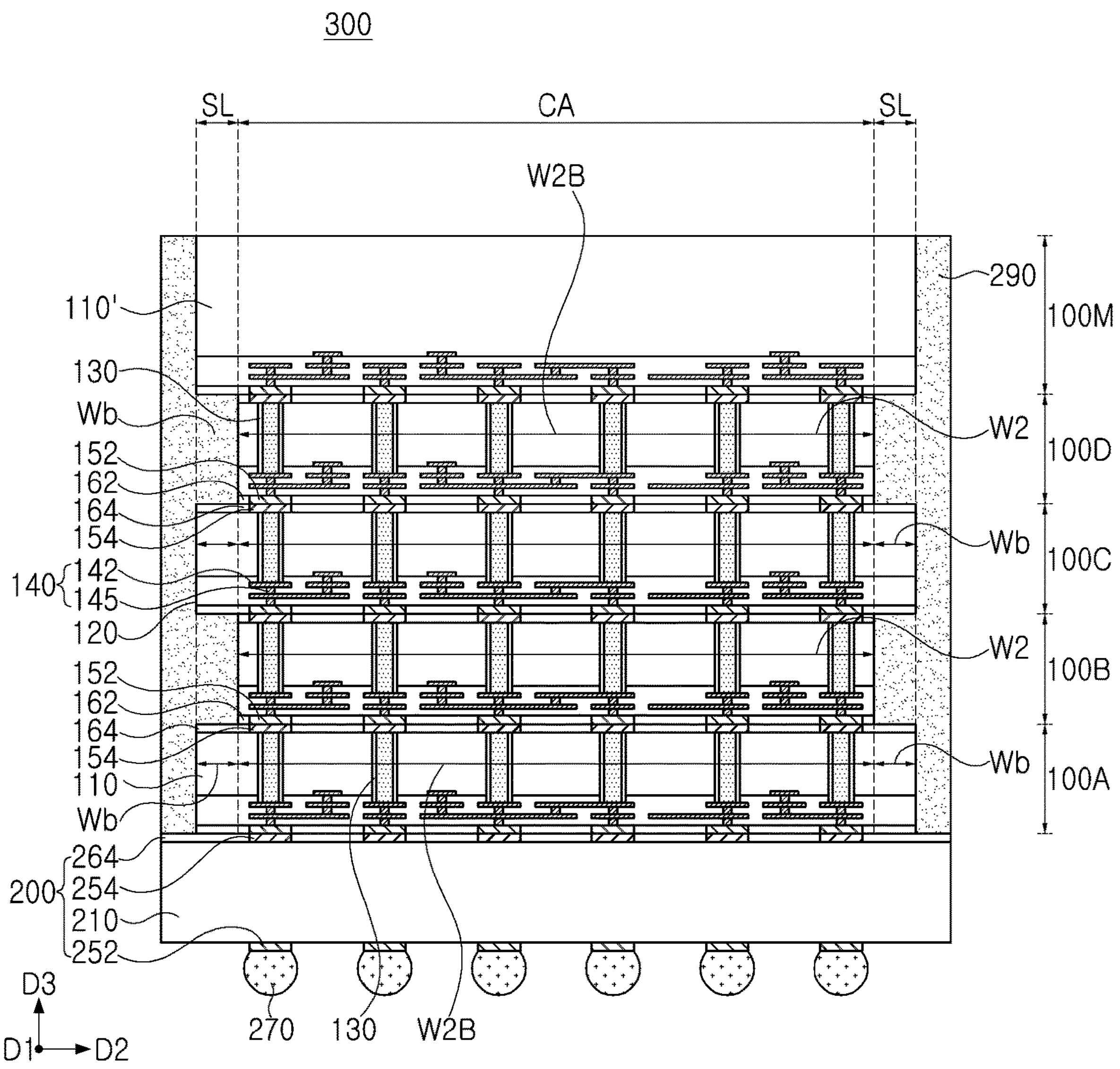

FIGS. 1A and 1B are cross-sectional views of a semiconductor package according to an embodiment of the present disclosure, cut in a first direction D1 and a second direction D2, respectively.

Referring to FIGS. 1A and 1B, a semiconductor package 300 may include a base structure 200 and a plurality of semiconductor chips 100A, 100B, 100C, 100D, and 100M, stacked on the base structure 200 in a vertical direction.

The base structure 200 may be an interposer or a semiconductor chip. The base structure 200 may have an area that is greater than an area of each of the plurality of semiconductor chips 100A, 100B, 100C, 100D, and 100M. When the base structure 200 is an interposer, the base structure 200 may include a substrate body 210, and a first pad 252 and a second pad 254, respectively disposed on upper and lower surfaces of the substrate body 210. For example, the substrate body 210 may be formed from a silicon wafer. The substrate body 210 may include a circuit wiring and/or a through-via, connecting the first pad 252 and the second pad 254 therein.

A connection bump 270 may be disposed on a lower surface of the base structure 200. The connection bump 270 may be attached on the first pad 252. The connection bump 270 may be, for example, a solder ball or a conductive bump. The connection bump 270 may electrically connect the semiconductor package 300 to another printed circuit board such as a motherboard.

The plurality of semiconductor chips may include a first semiconductor chip 100A, a second semiconductor chip 100B, a third semiconductor chip 100C, a fourth semiconductor chip 100D, and a fifth semiconductor chip 100M (or also referred to as "an uppermost semiconductor chip").

The plurality of semiconductor chips 100A, 100B, 100C, 100D, and 100M may include a semiconductor substrate 110 having a lower surface (also referred to as "an active surface" or "a front side") and an upper surface (also referred to as "an inactive surface" or "a backside"), opposite to each other, respectively. The first to fourth semiconductor chips 100A, 100B, 100C, and 100D may include a device layer 120 disposed on the lower surface of the semiconductor substrate 110, a through-electrode 130 penetrating the semiconductor substrate 110, a front surface pad 152 disposed on the device layer 120, and a backside pad 154 disposed on the upper surface of the semiconductor substrate 110. As in the present embodiment, the uppermost semiconductor chip 100M might not include the through-electrode 130. In addition, the uppermost semiconductor chip 100M may include a semiconductor substrate 110' having a relatively large thickness.

Figure 2A:
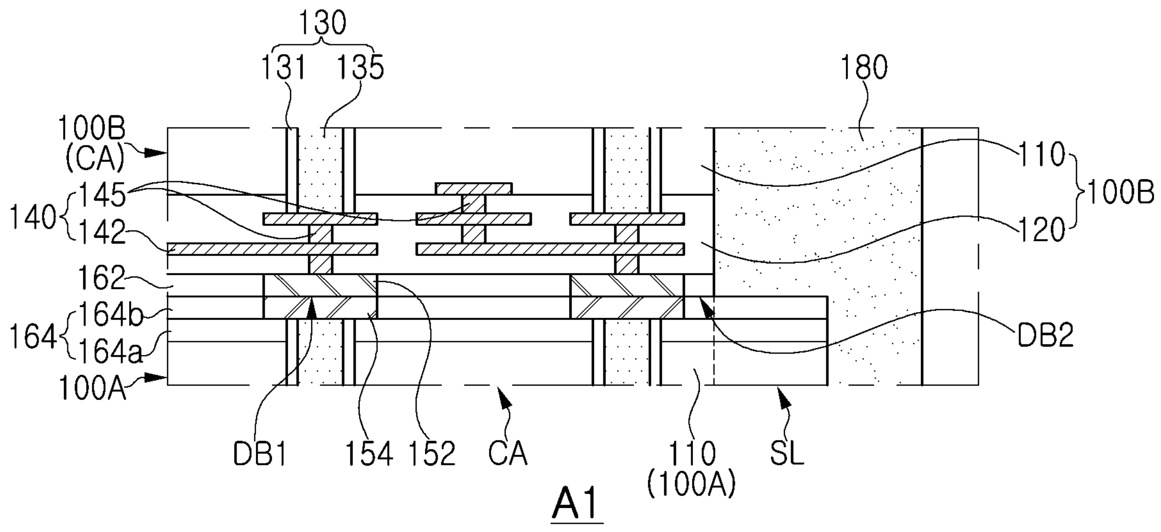
FIGS. 2A and 2B are cross-sectional views illustrating enlarged portions "A1" and "A2" of the semiconductor package of FIG. 1A, respectively.
Figure 2B:
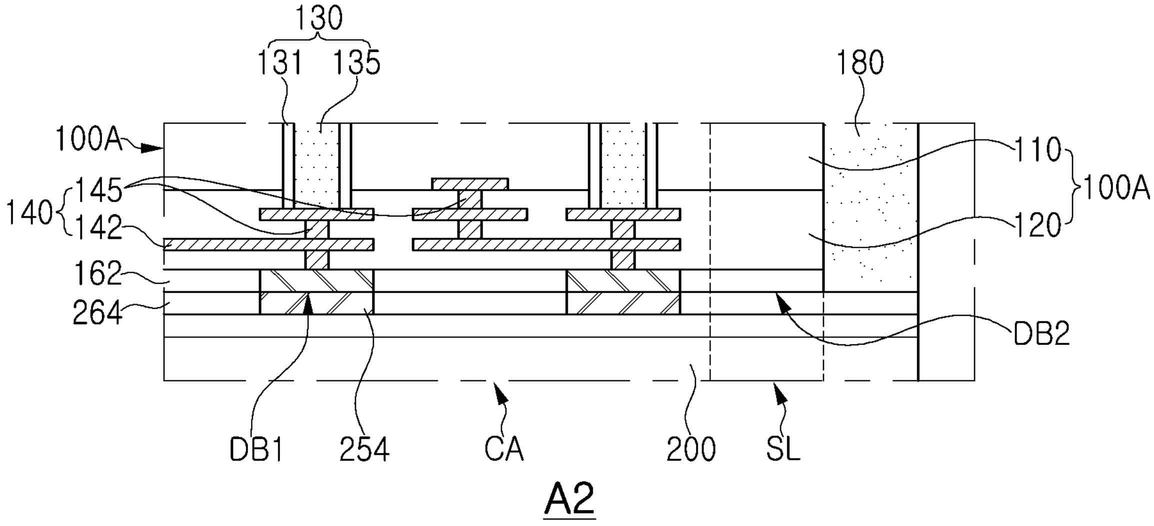

Referring to FIGS. 1A and 1B together with FIGS. 2A and 2B, the device layer 120 may be formed to include a plurality of individual elements (e.g., refer to 125 in FIG. 5) formed on a lower surface of each of the semiconductor substrates, and a wiring structure 140 connected to the plurality of individual elements. The wiring structure 140 may include a metal wiring layer 142 and a via 145. For example, the wiring structure 140 may have a multilayer structure in which two or more metal wiring layers 142 and/or two or more vias 145 are alternately stacked. The wiring structure 140 may be connected to the front surface pad 152 disposed on the lower surface of each of the plurality of semiconductor chips 100A, 100B, 100C, 100D, and 100M.

The through-electrode 130 may extend from backside pads 154 on the upper surface of the semiconductor substrate 110 toward the lower surface of the semiconductor substrate 110, and may be connected to the wiring structure 140. At least a portion of the through-electrode 130 may have a columnar shape. The through-electrode 130 may include a via plug 135 and a side surface insulating layer 131 at least partially surrounding the via plug 135. The side surface insulating layer 131 may electrically isolate the via plug 135 from the semiconductor substrate 110. As described above, the uppermost semiconductor chip 100M might not include the through-electrode 130.

As such, the through-electrode 130 may be connected to the wiring structure 140, to electrically connect the front surface pad 152 and the backside pad 154 of the first to fourth semiconductor chips 100A, 100B, 100C, and 100D.

The backside pads 154 of the plurality of semiconductor chips 100A, 100B, 100C, and 100D may be respectively connected to the front surface pads 152 of the other semiconductor chips 100B, 100C, 100D, and 100M disposed thereon. Front surface pads 152 of a lowermost first semiconductor chip 100A may be respectively connected to the second pads 254 of the base structure 200.

In the present embodiment, the backside pads 154 of the first to fourth semiconductor chips 100A, 100B, 100C, and 100D may be directly bonded to the front surface pads 152 of the second to fifth semiconductor chips 100B, 100C, 100D, and 100M, respectively.

FIGS. 2A and 2B are cross-sectional views illustrating enlarged portions "A1" and "A2" of the semiconductor package of FIG. 1A, respectively.

As illustrated in FIG. 2A, the backside pad 154 and the front surface pad 152 may be directly bonded to each other between adjacent first and second semiconductor chips 100A and 100B to provide metal bonding DB1. Therefore, the first and second semiconductor chips 100A and 100B may be fixed to each other, along with electrical connection therebetween. For example, metal bonding DB1 between the backside pad 154 and the front surface pad 152 may also be provided between the second and third semiconductor chips 100B and 100C, between the third and fourth semiconductor chips 100C and 100D, and between the fourth and fifth semiconductor chips 100D and 100M.

The backside pad 154 and the front surface pad 152 may include the same metal as each other, for example, copper (Cu). The backside pad 154 and the front surface pad 152 in direct contact may be bonded by interdiffusion of copper through a high-temperature annealing process. A metal forming the front surface pad 154 and the backside pad 152 is not necessarily limited to copper, and may include any material (e.g., Au) that may be bonded to each other.

Through such metal bonding, the stacked semiconductor chips may be firmly bonded, and electrical connection may be achieved without a separate connection bump. A path for transmitting and receiving at least one of a control signal, a power signal, a ground signal, or a data signal may be provided between the first to fifth semiconductor chips 100A, 100B, 100C, 100D, and 100M. Since a connection bump such as a solder might not be used, transmission loss may be reduced.

Each of the first to fourth semiconductor chips 100A, 100B, 100C, and 100D may include a backside insulating layer 164 disposed on the upper surface thereof, and the first to fifth semiconductor chips 100A, 100B, 100C, 100D, and 100M may include a front surface insulating layer 162 disposed on the lower surface thereof and forming dielectric bonding DB2 to the backside insulating layer 164. The backside insulating layer 164 and the front surface insulating layer 162 may include the same material. For example, the backside insulating layer 164 and the front surface insulating layer 162 may include silicon oxide. The dielectric bonding DB2 between the backside insulating layer 164 and the front surface insulating layer 162 may be performed by a high-temperature annealing process in a direct contact state. The dielectric bonding DB2 may have stronger bonding strength due to covalent bonding. An insulating material forming the backside insulating layer 164 and the front surface insulating layer 162 is not necessarily limited to the silicon oxide, and may include any material that may be bonded to each other (e.g., SiCN).

As illustrated in FIG. 2A, the backside insulating layer 164 employed in the present embodiment may be a first backside insulating layer 164*a* and a second backside insulating layer 164*b*, sequentially disposed on the upper surfaces of each of the first to fourth semiconductor chips 100A, 100B, 100C, and 100D. The through-electrode 130 may have an upper surface passing through the first backside insulating layer 164*a* and substantially coplanar with an upper surface of the first backside insulating layer 164*a*. The backside pad 154 may be formed on the first backside insulating layer 164*a*, and may be connected to the through-electrode 130. The first backside insulating layer 164*a* may be a passivation layer, and may prevent unwanted electrical connection between the backside pad 154 and the semiconductor substrate 110. In addition, the backside pad 154 may be buried in the second backside insulating layer 164*b* to expose an upper surface of the backside pad 154. The backside pad 154 may have the upper surface substantially coplanar with an upper surface of the second backside insulating layer 164*b*.

The first and second backside insulating layers 164*a* and 164*b* may include the same material, but are not necessarily limited thereto, and may include different materials. For example, the first backside insulating layer 164*a* may include silicon nitride or silicon oxynitride, and the second backside insulating layer 164*b* may include silicon oxide. When the first and second backside insulating layers 164*a* and 164*b* are formed of different materials, the second backside insulating layer 164*b* directly bonded to the front surface insulating layer 162 may include the same material as the front surface insulating layer 162, as described above.

As illustrated in FIG. 2B, a base insulating layer 264 may be formed on the upper surface of the base structure 200 employed in the present embodiment, and the base insulating layer 264 may have an upper surface substantially coplanar with an upper surface of the connection pad 254. The base structure 200 and the first semiconductor chip 100A may be bonded using a hybrid-bonding structure, similar to bonding between adjacent semiconductor chips.

The connection pad 252 of the base structure 200 and the front surface pad 152 of the first semiconductor chip 100A may be directly bonded to each other to have the metal bonding DB1. Along with the metal bonding DB1, the base insulating layer 264 and the front surface insulating layer 162 of the first semiconductor chip 100A may be directly bonded to each other to form the dielectric bonding DB2. As described above, the base structure 200 may have an area, larger than an area of each of the semiconductor chips. The base insulating layer 264 may also have a portion that is not covered by the semiconductor chips.

As described above, in the present embodiment, together with the metal bonding DB1 in which the front surface pad 152 and the backside pad 154 are directly bonded, the dielectric bonding DB2 may firmly bond the first to fifth semiconductor chips 100A, 100B, 100C, 100D, and 100M, stacked together, as well as the base structure, by a hybrid bonding method, and may form an electrical path for reducing loss.

Inter-chip bonding employed in the present embodiment is exemplified as hybrid bonding, but is not necessarily limited thereto, and, in some embodiments, may be implemented as other types of bonding, for example, bonding using a non-conductive film (NCF) (see FIGS. 7A to 9B).

In the present embodiment, the plurality of semiconductor chips 100A, 100B, 100C, 100D, and 100M may have different sizes. For example, the plurality of semiconductor chips 100A, 100B, 100C, 100D, and 100M may have chip regions CA respectively having the same area as each other, but may have different widths, depending on the presence or absence of scribe regions SL disposed on each side of each of the chip regions CA.

In this specification, the "chip region CA" refers to a region in which a plurality of individual elements and a plurality of through-electrodes 130 are formed. The chip region CA refers to a region excluding a scribe lane region on a wafer level, before being cut into the semiconductor chips, and a scribe lane portion remaining on at least one side of the chip region CA on a semiconductor chip level, after being cut, may be the "scribe region SL." In a process of cutting a wafer 100W1 (FIG. 4) into individual chips, a width of each of the semiconductor chips 100A, 100B, 100C, 100D, and 100M may be adjusted by selectively preserving the scribe region SL on at least one side of the chip region CA.

FIGS. 1A and 1B illustrate a cross-section of the semiconductor package 300 viewed in the first direction D1 and a cross-section of the semiconductor package 300 viewed in the second direction D2, respectively.

Referring to FIGS. 1A and 1B, the plurality of semiconductor chips 100A, 100B, 100C, 100D, and 100M may be stacked in a vertical direction D3 such that the chip regions CA at least partially overlap each other.

A stack of the semiconductor chips 100A, 100B, 100C, 100D, and 100M on the base structure 200 may have a side profile having a zigzag-shape of different widths W1A and W1 or W2B and W2 of each of the semiconductor chips 100A, 100B, 100C, 100D, and 100M. At least one semiconductor chip, among the plurality of semiconductor chips 100A, 100B, 100C, 100D, and 100M, may have a width that is smaller than a width of a semiconductor chip, disposed below the at least one semiconductor chip. Hereinafter, the widths of the plurality of semiconductor chips 100A, 100B, 100C, 100D, and 100M may be respectively defined by a first width in the first direction D1 and a second width in the second direction D2.

This arrangement may distribute stress due to warpage of the base structure 200 having a relatively large area to the upper surfaces of some of the semiconductor chips 100A and 100C, to prevent mechanical damage. For example, when smile-shaped warpage occurs in the base structure 200 (e.g., a concave warpage), stress concentrated on the base structure 200 and a lower edge of the stack of the semiconductor chips may be dispersed onto the upper surface of each of the semiconductor chips 100A and 100C having a width that is greater than a width of each of the semiconductor chips disposed on each of the semiconductor chips 100A and 100C. For example, stress due to warpage of the base structure 200 may be dispersed onto regions on both sides of the upper surface of the first semiconductor chip 100A in FIG. 1A, and regions on both sides of the upper surface of the first semiconductor chip 100A and regions on both sides of the upper surface of the third semiconductor chip 100C in FIG. 1B, respectively.

As illustrated in FIGS. 1A and 1B, a first side profile (see FIG. 1B) viewed in the first direction D1 may be different from a second side profile (see FIG. 1A) viewed in the second direction D2, perpendicular to the first direction D1. The first and second side profiles, that are different from each other, may be due to different asymmetric planar shapes of the third semiconductor chip 100C and the fourth semiconductor chip 100D.

For example, referring to FIG. 1A, the third semiconductor chip 100C does not have the scribe region SL on both sides thereof in the first direction D1, while the fourth semiconductor chip 100D has the scribe region SL on both sides thereof in the first direction D1. Therefore, a first width W1A of the fourth semiconductor chip 100D may be greater than a first width W1 of the third semiconductor chip 100C. In contrast, referring to FIG. 1B, the third semiconductor chip 100C has the scribe region SL on both sides thereof in the second direction D2, while the fourth semiconductor chip 100D does not have the scribe region SL on both sides thereof in the second direction D2. Therefore, a second width W2B of the third semiconductor chip 100C may be greater than a second width W2 of the third semiconductor chip 100C.

As such, a first width of one semiconductor chip may be greater than a first width of another semiconductor chip, and a second width of one semiconductor chip may be smaller than a second width of another semiconductor chip. In some embodiments, a second width of one semiconductor chip may be equal to a second width of another semiconductor chip. a second width of one semiconductor chip may be greater than a second width of another semiconductor chip, and a first width of one semiconductor chip may be equal to or smaller than a first width of another semiconductor chip.

Figure 3:
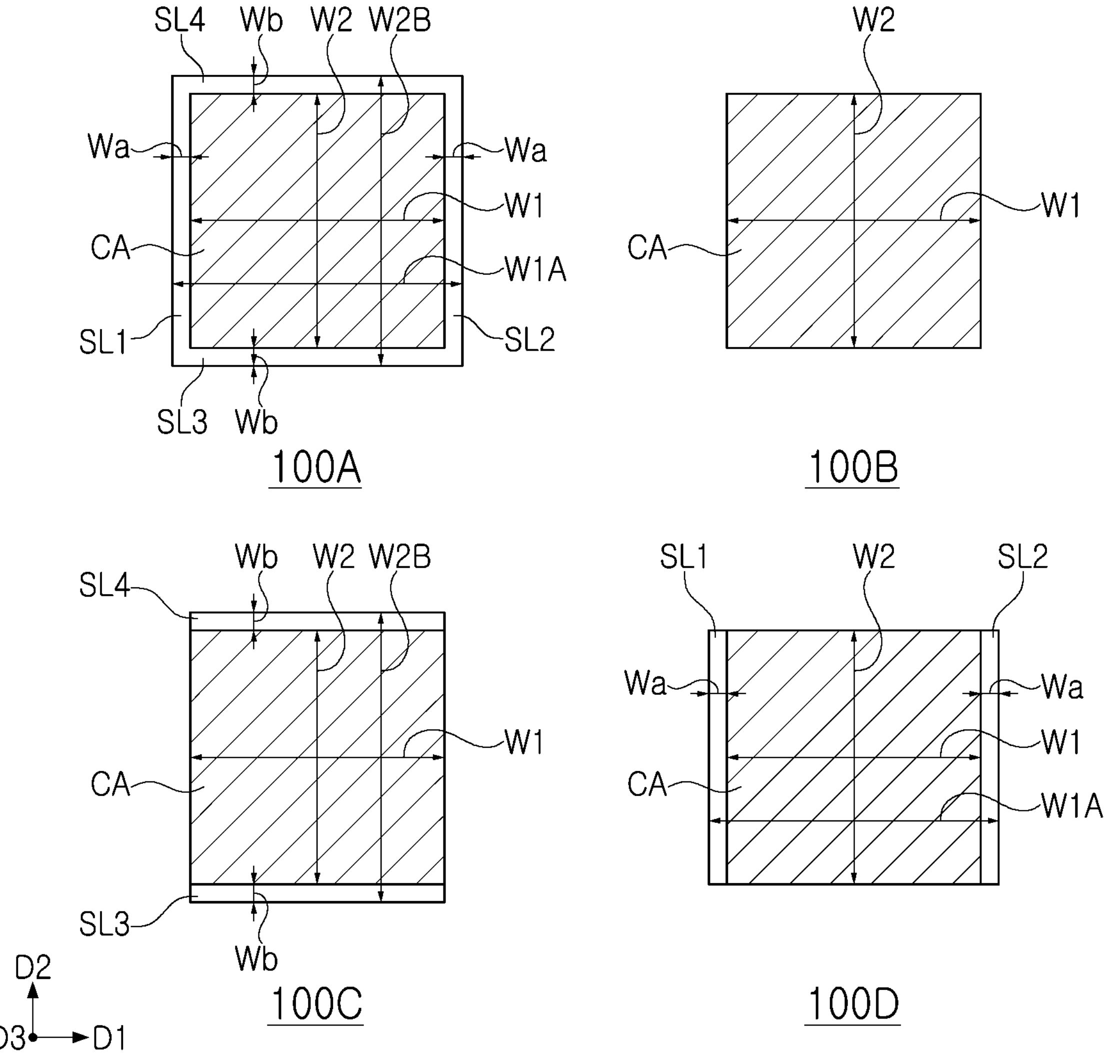
FIG. 3 are plan views of first to fourth semiconductor chips employed in the semiconductor packages of FIGS. 1A and 1B.

In the present embodiment, in addition to the third and fourth semiconductor chips 100C and 100D, the first and second semiconductor chips 100A and 100B may have various width conditions. FIG. 3 illustrates planes of the first to fourth semiconductor chips 100A, 100B, 100C, and 100D employed in the present embodiment.

As described above, the first to fourth semiconductor chips 100A, 100B, 100C, and 100D may have chip regions having the same area. First widths of the chip regions may be equal to each other, and second widths of the chip regions may also be equal to each other. The first width W1 and the second width W2 of the chip region CA may be the same or similar to each other, but may be different from each other in some embodiments.

The first to fourth semiconductor chips 100A, 100B, 100C, and 100D having chip regions CA having substantially the same area may have different widths by selectively preserving the scribe regions SL.

The first semiconductor chip 100A may have the scribe region SL at least partially surrounding all four sides of the chip region CA. The first semiconductor chip 100A may have the first width W1A, greater than the first width W1 of the chip region CA, by widths (Wax2) of first and second scribe regions SL1 and SL2. For example, the first semiconductor chip 100A may have the second width W1B, greater than the second width W2 of the chip region CA, by widths (Wbx2) of third and fourth scribe regions SL3 and SL4.

The second semiconductor chip 100B may include only the chip region CA without a remaining scribe region. The second semiconductor chip 100B may have the first width W1 and the second width W2, equal to widths of the chip region CA.

As described above, the third semiconductor chip 100C may have the third and fourth scribe regions SL3 and SL4 on both sides thereof in the second direction D2. The first width W1 of the third semiconductor chip 100C may be equal to the chip region CA, and the second width W2B of the third semiconductor chip 100C may be greater than the second width W2 of the chip region CA by the widths (Wbx2) of the third and fourth scribe regions SL3 and SL4.

The fourth semiconductor chip 100D may have the first and second scribe regions SL1 and SL2 on both sides thereof in the first direction D1. The second width W2 of the fourth semiconductor chip 100D may be equal to the chip region CA, and the first width W1A of the fourth semiconductor chip 100D may be greater than the first width W1 of the chip region CA by the widths (Wax2) of the first and second scribe regions SL1 and SL2.

Figure 4:
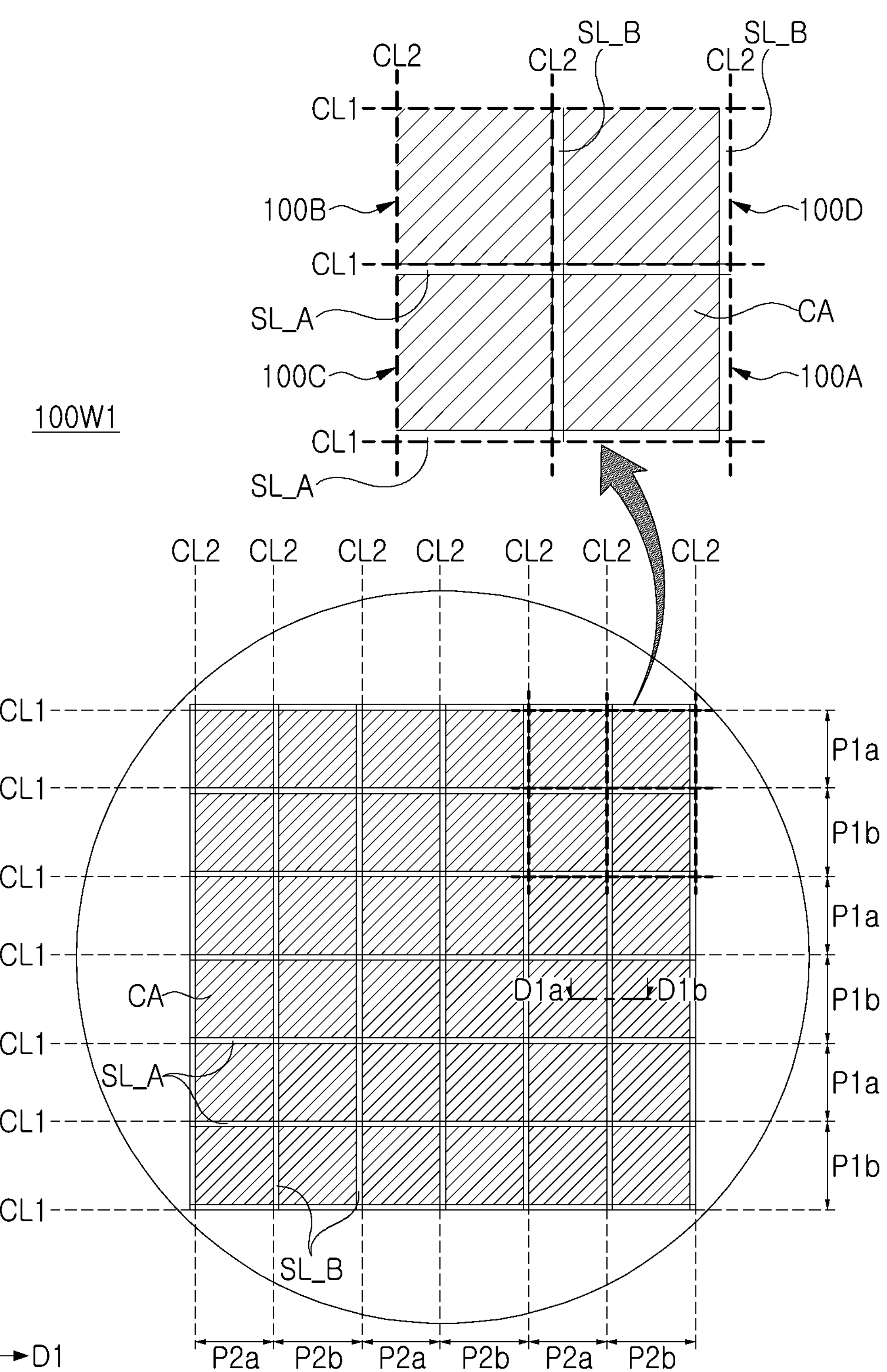
FIG. 4 is a plan view of a wafer illustrating a wafer cutting process for obtaining first to fourth semiconductor chips employed in the semiconductor packages of FIGS. 1A and 1B.

The remaining the scribe region SL for the first to fourth semiconductor chips 100A, 100B, 100C, and 100D, according to the present embodiment, may be obtained by using a cut line for cutting a wafer. FIG. 4 is a plan view of a wafer 100W1 illustrating a wafer cutting process for obtaining first to fourth semiconductor chips 100A, 100B, 100C, and 100D employed in the semiconductor packages 300 of FIGS. 1A and 1B.

Referring to FIG. 4, a wafer 100W1 for the plurality of semiconductor chips is illustrated. The wafer 100W1 may include a plurality of chip regions CA arranged in a plurality of rows and a plurality of columns, and scribe lanes SL_A and SL_B therebetween.

Figure 5:
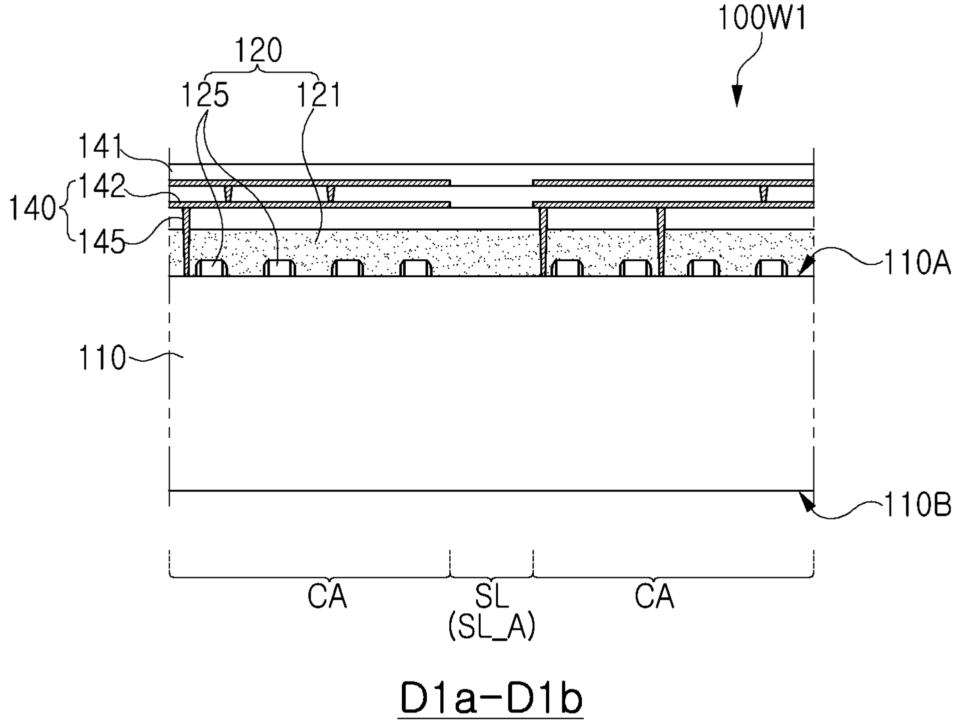
FIG. 5 is a cross-sectional view of the wafer of FIG. 4, taken along line D1*a*-D1*b;*

FIG. 5 is a cross-sectional view of the wafer of FIG. 4, taken along line D1*a*-D1*b*. Referring to FIG. 5, a semiconductor substrate 110 having an active surface 110A and an inactive surface 110B, disposed opposite to each other, is illustrated. As described above, a device layer 120 having an interlayer insulating film 121 and a wiring structure 140 having a low dielectric film 141 may be disposed on the active surface 110A of the semiconductor substrate 110. Individual elements 125 and wiring patterns 142 and 145 connected thereto may be formed on the active surface 110A in the chip region CA, while a dummy region on which the individual elements 125 are not formed may be provided in the scribe lane SL_A.

Scribe lanes may include first scribe lanes SL_A in the first direction D1 and second scribe lanes SL_B in the second direction D2. The first scribe lanes SL_A and the second scribe lanes SL_B may have a constant width, respectively. In some embodiments, the first scribe lanes SL_A and the second scribe lanes SL_B may have the same width as each other.

Positions of cut lines CL1 and CL2, actually cut in the first and second scribe lanes SL_A and SL_B, may be adjusted to selectively remain the scribe lanes around the chip region CA cut individually.

For example, as illustrated in FIG. 4, a first cut line CL1 in the first direction D1 may be repeated at a period of a first pitch P1*a* corresponding to the chip region CA, and a second pitch P1*b* corresponding to the chip region CA and two (2) first scribe lanes SL_A, and a second cut line CL2 in the first direction D1 may be repeated at a period of a third pitch P2*a* corresponding to the chip region CA, and a fourth pitch P2*b* corresponding to the chip region CA and two (2) second scribe lanes SL_B. The widths Wb and Wa of actual remaining scribe regions may be widths excluding a width of a kerf region consumed when cutting in the first and second scribe lanes SL_A and SL_B. The first and second cut lines CL1 and CL2 may be moved at the above-described pitch cycle to perform a smooth cutting process, and as illustrated in the enlarged view of FIG. 4, first to fourth semiconductor chips 100A, 100B, 100C, and 100D having different widths, as described in FIG. 3, may be manufactured.

Since first and second scribe regions SL1 and SL2 having a constant width may be cut by a cut line moved at the above-described pitch period, the scribe regions SL1 and SL2, and scribe regions SL3 and SL4, disposed in the same direction, may have substantially the same widths Wa and Wb.

In the present embodiment, referring to FIG. 3, the first and second scribe regions SL1 and SL2 of the fourth semiconductor chip 100D may have substantially the same width Wa as each other. The widths Wa of the first and second scribe regions SL1 and SL2 of the first semiconductor chip 100A may be substantially equal to each other, and the first and second scribe regions SL1 and SL2 of the fourth semiconductor chip 100D may be substantially equal to the widths of the first and second scribe regions SL1 and SL2 of the first semiconductor chip 100A. For example, the third and fourth scribe regions SL3 and SL4 of the third semiconductor chip 100C may have substantially the same width Wb, and the width Wb of the third and fourth scribe regions SL3 and SL4 of the third semiconductor chip 100C may be substantially equal to the width Wb of the third and fourth scribe regions SL3 and SL4 of the first semiconductor chip 100A.

In the present embodiment, semiconductor chips cut to have different widths are illustrated as being limited to the first to fourth semiconductor chips 100A, 100B, 100C, and 100D, and the uppermost semiconductor chip 100M is illustrated as being a chip having a width corresponding to the first semiconductor chip 100A, but is not necessarily limited thereto, and the uppermost semiconductor chip 100M may also have a different size. For example, the uppermost semiconductor chip 100M may have scribe regions SL disposed on two (2) adjacent sides of the chip region CA, and may be manufactured using a separate wafer.

In addition, in the present embodiment, a stack in which five semiconductor chips 100A, 100B, 100C, 100D, and 100M are stacked is illustrated, but only a stack of the first to fourth semiconductor chips 100A, 100B, 100C, and 100D may be included. In this case, the fourth semiconductor chip 100D might not include the through-electrode 130, similar to the uppermost semiconductor chip 100M. In this case, when a wafer 100W1 (FIG. 4) for semiconductor chips is prepared, formation of through-electrodes may be omitted only in the chip regions of the fourth semiconductor chip 100D.

The plurality of semiconductor chips 100A, 100B, 100C, 100D, and 100M may be memory chips or logic chips. In one example, the plurality of semiconductor chips 100A, 100B, 100C, 100D, and 100M may all be memory chips of the same type, and in another example, some of the plurality of semiconductor chips 100A, 100B, 100C, 100D, and 100M may be memory chips, and a remaining portion thereof may be a logic chip.

For example, the memory chip may be a volatile memory chip such as a dynamic random access memory (DRAM) or a static random access memory (SRAM), or may be a non-volatile memory chip such as a phase-change random access memory (PRAM), a magnetoresistive random access memory (MRAM), a ferroelectric random access memory (FeRAM) or a resistive random access memory (RRAM). In some embodiments, the plurality of semiconductor chips 100A, 100B, 100C, 100D, and 100M may be high bandwidth memory (HBM) DRAMs.

Also, the logic chip may be, for example, a microprocessor, an analog device, or a digital signal processor.

In the present embodiment, the base structure 200 is illustrated as an interposer, but in some embodiments, the base structure 200 may be a semiconductor chip. For example, the plurality of semiconductor chips 100A, 100B, 100C, 100D, and 100M may be memory chips, and the base structure 200 may be a logic chip such as a microprocessor.

Although the present embodiment illustrates the semiconductor package 300 in which a plurality of semiconductor chips 100A, 100B, 100C, 100D, and 100M are stacked, the number of semiconductor chips stacked in the semiconductor package 300 is not necessarily limited thereto. For example, two (2), four (4), or more semiconductor chips (e.g., eight (8) or twelve (12)) may be stacked in the semiconductor package 300.

A molding portion 290 may be formed on the base structure 200 and may surround some or all of the plurality of semiconductor chips 100A, 100B, 100C, 100D, and 100M. The molding portion 290 may include, for example, an epoxy mold compound. As illustrated in FIGS. 1A and 1B, the upper surface of the uppermost semiconductor chip 100M may be exposed from an upper surface of the molding portion 290, and the upper surface of the uppermost semiconductor chip 100M may be substantially coplanar with the upper surface of the molding portion 290. The molding portion 290 may be disposed on the base structure 200, and may have a surface, substantially coplanar with a side surface of the base structure 200. These coplanar side surfaces can be understood as side surfaces obtained by the same cutting process.

Figure 6:
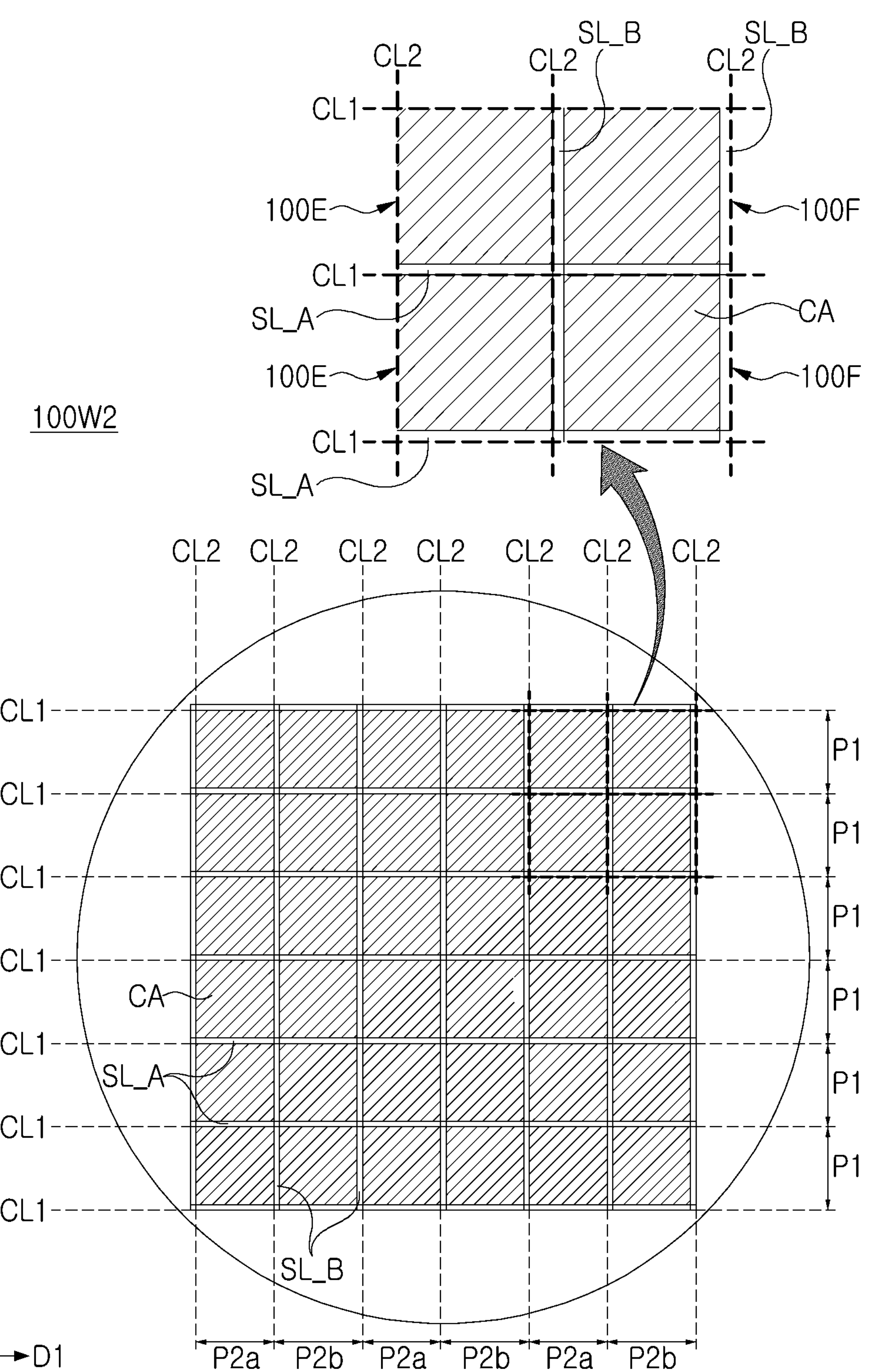
FIG. 6 is a plan view of a wafer illustrating a wafer cutting process for obtaining semiconductor chips employed in a semiconductor package according to an embodiment of the present disclosure.

FIG. 6 is a plan view of a wafer illustrating a wafer cutting process for obtaining semiconductor chips employed in a semiconductor package according to an embodiment of the present disclosure.

Referring to FIG. 6, first and second cut lines CL1 and CL2 cutting a wafer 100W2 for fifth and sixth semiconductor chips 100E and 100F are illustrated. The wafer 100W2 may include a plurality of chip regions CA arranged in a plurality of rows and a plurality of columns, and first scribe lanes SL_A in the first direction D1 and second scribe lanes SL_B in the second direction D2, therebetween.

In the present embodiment, the first cut line CL1 in the first direction D1 may be repeated at a period of a pitch P1 corresponding to the chip region CA and one first scribe lane SL_A, and the second cut line CL2 in the second direction D2 may be repeated at a period of a third pitch P2*a* corresponding to the chip region CA, and a fourth pitch P2*b* corresponding to the chip region CA and two (2) second scribe lanes SL_B, similar to FIG. 4.

After cutting the wafer 100W2 along the first and second cut lines CL1 and CL2, the fifth and sixth semiconductor chips 100E and 100F having width conditions, different from that of the first to fourth semiconductor chips 100A, 100B, 100C, and 100D, described above, may be obtained. The fifth semiconductor chip 100E may have a fifth scribe region disposed on one side of the chip region CA, and the sixth semiconductor chip 100F may have a sixth scribe region at least partially surrounding three sides of the chip region CA, except for one side thereof.

In the present embodiment, a first width of the sixth semiconductor chip 100F may be greater than a first width of the fifth semiconductor chip 100E, and a second width of the sixth semiconductor chip 100F may be equal to a second width of the fifth semiconductor chip 100E.

Figure 8A:
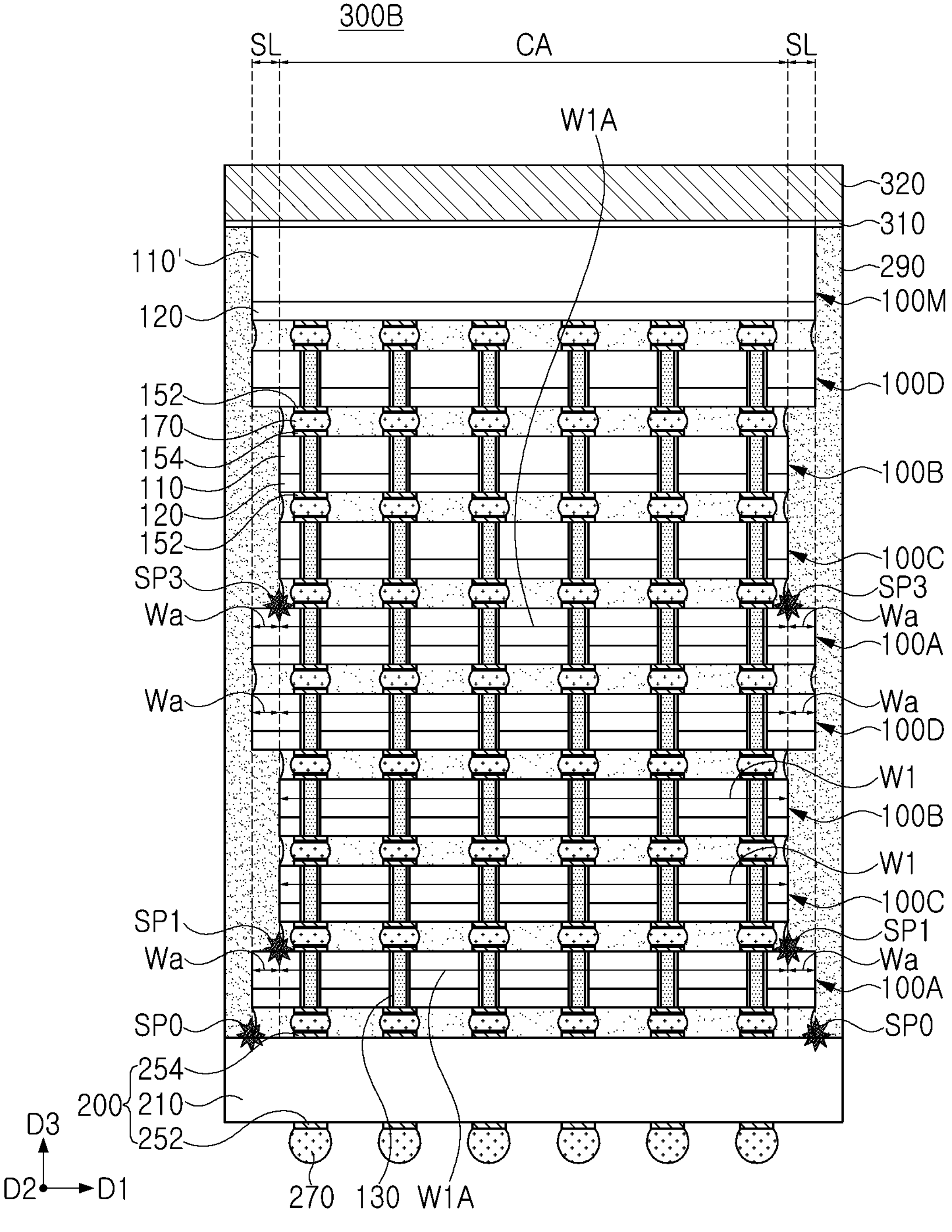
FIGS. 8A and 8B are cross-sectional views of a semiconductor package according to an embodiment of the present disclosure, cut in a first direction D1 and a second direction D2, respectively.
Figure 8B:
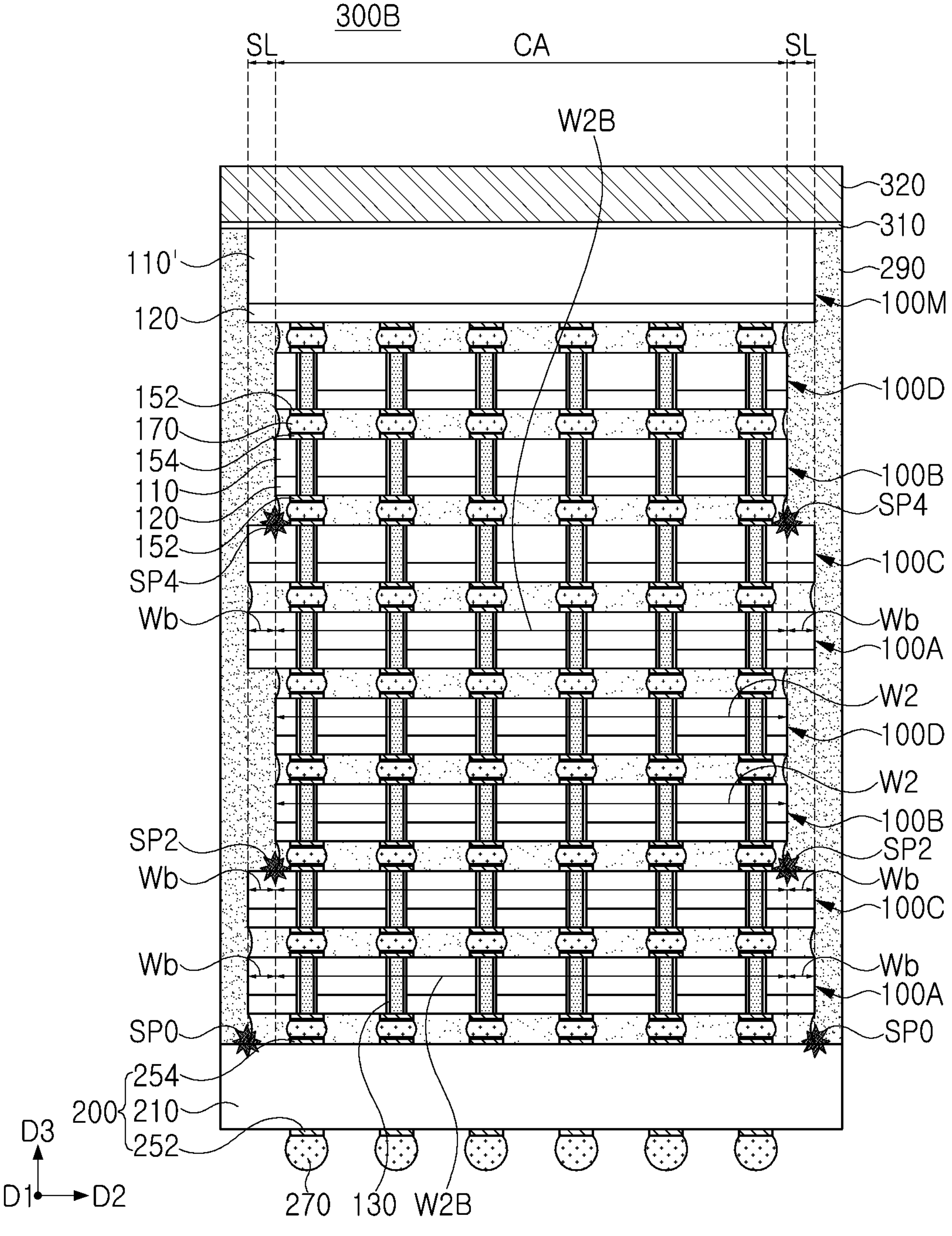

The fifth semiconductor chip 100E and the sixth semiconductor chip 100F according to the present embodiment may replace the stack of the semiconductor chips of the semiconductor package 300 illustrated in FIGS. 1A and 1B or may be combined with the first to fourth semiconductor chips 100A, 100B, 100C, and 100D, and stacked (see FIGS. 8A and 8B).

Figure 7A:
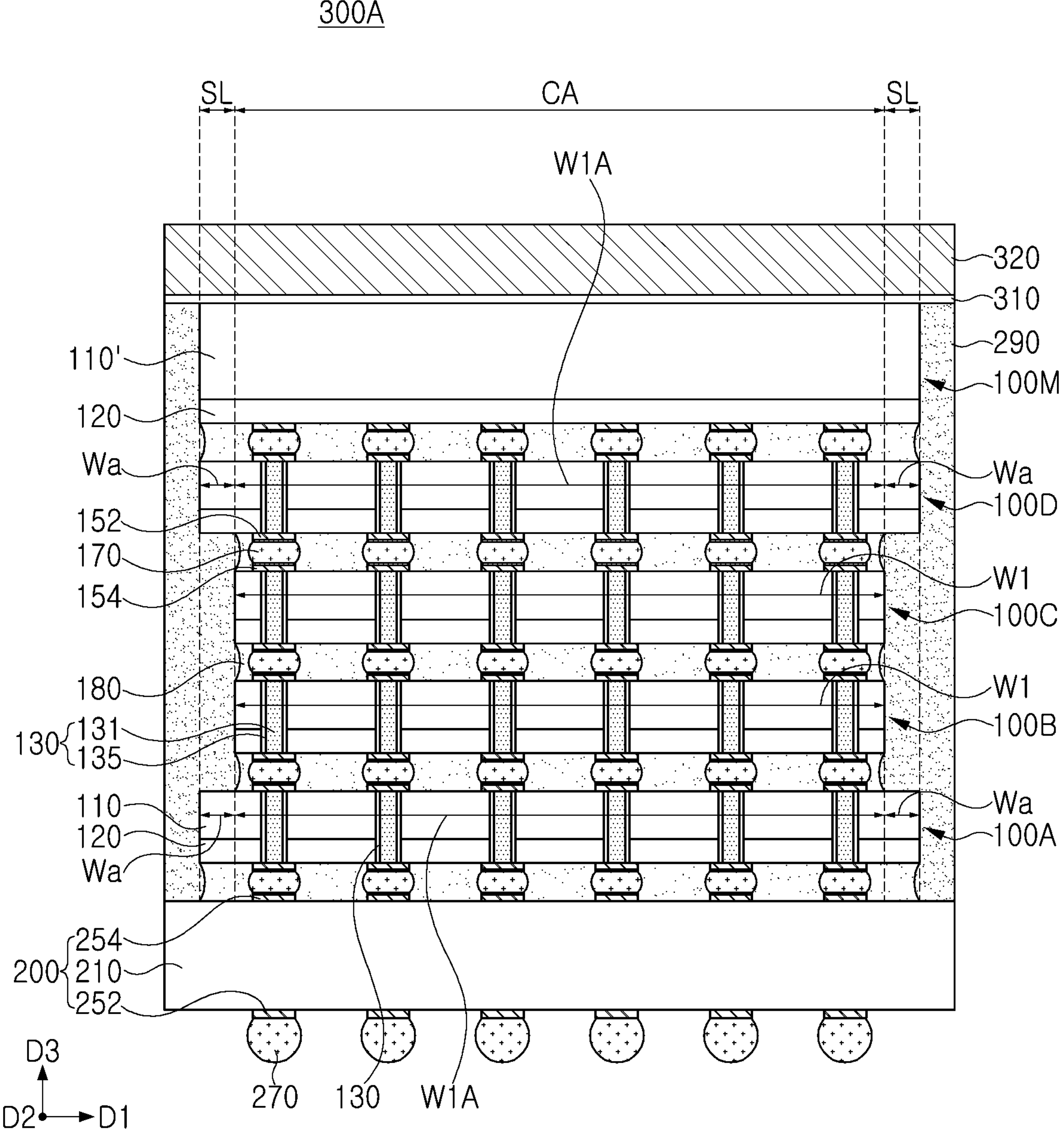
FIGS. 7A and 7B are cross-sectional views of a semiconductor package according to an embodiment of the present disclosure, cut in a first direction D1 and a second direction D2, respectively.
Figure 7B:
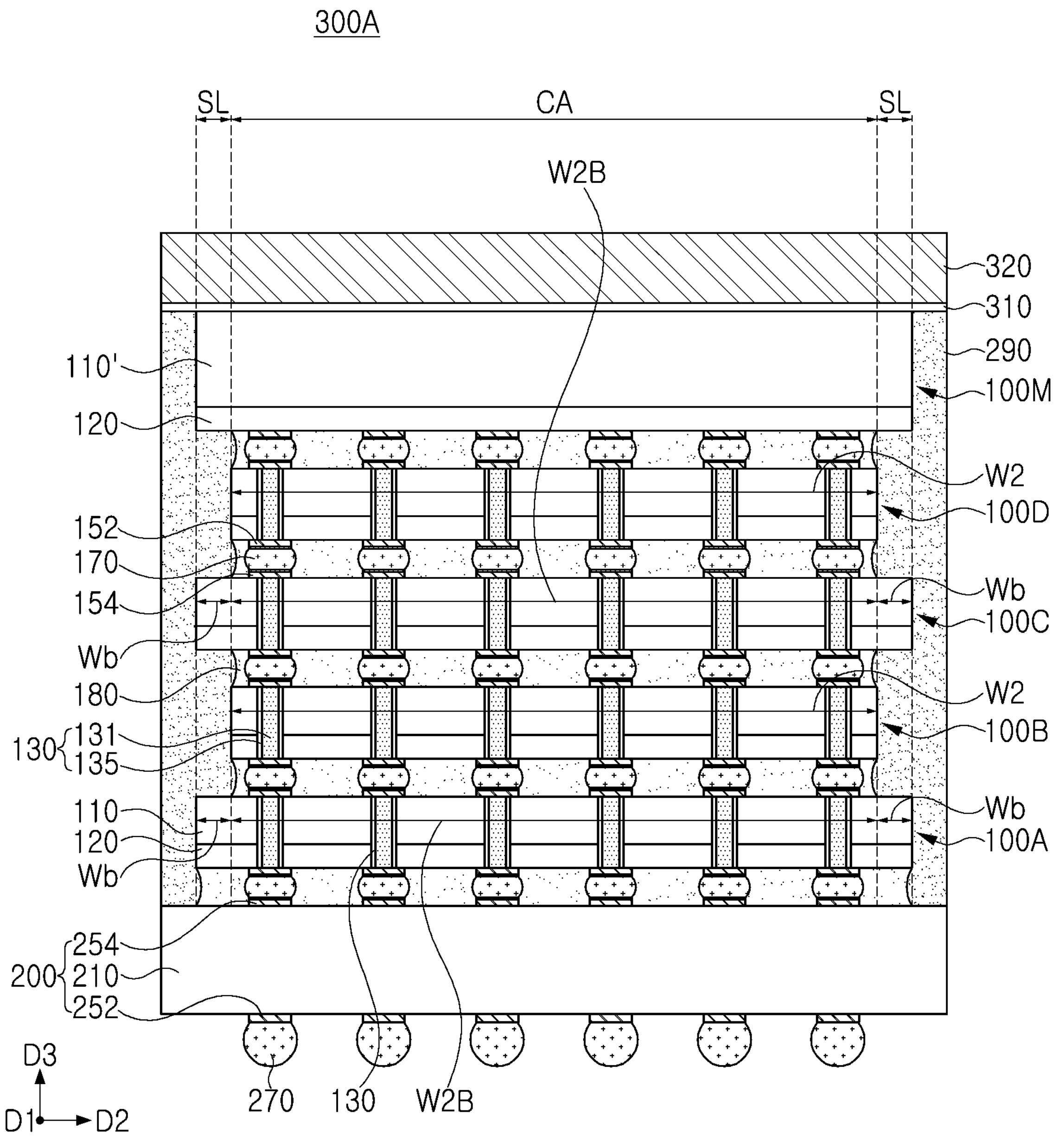

FIGS. 7A and 7B are cross-sectional views of a semiconductor package according to an embodiment of the present disclosure, cut in a first direction D1 and a second direction D2, respectively.

Referring to FIGS. 7A and 7B, it can be understood that a semiconductor package 300A according to the present embodiment is similar to the embodiment illustrated in FIGS. 1A and 1B, except that a non-conductive film 180 is provided between a base structure 200 and semiconductor chips 100A, 100B, 100C, 100D, and 100M, respectively, and a heat dissipation plate 320 is disposed on a stack of the semiconductor chips. Therefore, the description of the embodiment illustrated in FIGS. 1A and 1B may be combined with description of the present embodiment, unless otherwise stated.

Similar to the previous embodiment, the semiconductor package 300A according to the present embodiment may include a first semiconductor chip 100A, a second semiconductor chip 100B, a third semiconductor chip 100C, a fourth semiconductor chip 100D, and a fifth semiconductor chip 100M, stacked on the base structure 200 in the vertical direction D3.

Similar to the semiconductor chips employed in the previous embodiment, the first to fifth semiconductor chips 100A, 100B, 100C, 100D, and 100M may include a semiconductor substrate 110 or 110' and a device layer 120. The device layer 120 may include a plurality of individual elements 125 disposed on a lower surface of the semiconductor substrate 110 or 110', and a wiring structure 140 similar to the previous embodiment. The four semiconductor chips 100A, 100B, 100C, and 100D may include a through-electrode 130 penetrating the semiconductor substrate 110 to electrically connect front surface pads 152 and backside pads 154 to each other. The fifth semiconductor chip 100M might not include the through-electrode 130. Also, the fifth semiconductor chip 100M may include a relatively thick semiconductor substrate 110'.

The backside pads 154 of the first to fourth semiconductor chips 100A, 100B, 100C, and 100D may be connected to the front surface pads 152, respectively, by a conductive bump 170. For example, backside pads 254 of the base structure 200 may be connected to the front surface pads 152 of the first semiconductor chip 100A, disposed thereon, by the conductive bump 170.

In the present embodiment, the first to fifth semiconductor chips 100A, 100B, 100C, 100D, and 100M may be attached to each other by non-conductive films 180. The non-conductive films 180 may be formed to surround a conductive bump. For example, the non-conductive films 180 may serve to adhere to the stacked semiconductor chips 100A, 100B, 100C, 100D, and 100M. For example, a non-conductive film 180 may be disposed between the base structure 200 and the first semiconductor chip 100A. The non-conductive films 180 may include an adhesive resin. The adhesive resin may be a thermosetting resin. The adhesive resin may include, for example, at least one of a bisphenol-type epoxy resin, a noblock-type epoxy resin, a phenol resin, a urea resin, a melamine resin, an unsaturated polyester resin, and a resorcinol resin. In the present embodiment, the non-conductive films 180 may have a concave side surface, drawn inwardly more than side surfaces of adjacent semiconductor chips 100A, 100B, 100C, 100D, and 100M.

The semiconductor chips 100A, 100B, 100C, 100D, and 100M employed in the present embodiment may have chip regions CA having the same area as each other, and may be stacked in the vertical direction D3 such that the chip regions CA least partially overlap each other. Each of the plurality of semiconductor chips 100A, 100B, 100C, 100D, and 100M may have a different width, depending on whether or not a scribe region SL disposed on each side of the chip region CA is present, similar to the previous embodiment. FIGS. 7A and 7B illustrate a cross-section of the semiconductor package 300A viewed in the first direction D1, and a cross-section of the semiconductor package 300A viewed in the second direction D2, respectively.

Referring to FIGS. 7A and 7B, the stack of semiconductor chips 100A, 100B, 100C, 100D, and 100M on the base structure 200 may have a side profile having a zigzag-shape of different widths W1A and W1 or W2B and W2 of each of the semiconductor chips 100A, 100B, 100C, 100D, and 100M, similar to the previous embodiment. A first side profile (see FIG. 7B) viewed in the first direction D1 may be different from a second side profile (see FIG. 7A) viewed in the second direction D2, perpendicular to the first direction D1. In this stack, stress due to warpage of the base structure 200 having a relatively large area may be distributed to upper surfaces of some of the semiconductor chips 100A and 100C.

The semiconductor package 300A, according to the present embodiment, may further include a thermal conductive material layer 310 and a heat dissipation plate 320, sequentially disposed on an upper surface of the uppermost semiconductor chip 100M.

The thermal conductive material layer 310 may be disposed between the heat dissipation plate 320 and the uppermost semiconductor chip 100M, and may cover the upper surface of the uppermost semiconductor chip 100M. The thermal conductive material layer 310 may help heat generated in the first to fifth semiconductor chips 100A, 100B, 100C, 100D, and 100M to be smoothly discharged to the heat dissipation plate 320. The thermal conductive material layer 310 may include a thermal interface material (TIM). For example, the thermal conductive material layer 310 may include an insulating material, or a material that may maintain electrical insulation including the insulating material. The thermal conductive material layer 310 may include, for example, an epoxy resin. Specific examples of the thermal conductive material layer 310 may include mineral oil, grease, gap filler putty, phase change gel, a phase change material pad, or particle filled epoxy.

The heat dissipation plate 320 may be disposed on the thermal conductive material layer 310. The heat dissipation plate 320 may be, for example, a heat sink, a heat spreader, a heat pipe, or a liquid cooled cold plate.

FIGS. 8A and 8B are cross-sectional views of a semiconductor package according to an embodiment of the present disclosure, cut in a first direction D1 and a second direction D2, respectively.

Referring to FIGS. 8A and 8B, it can be understood that a semiconductor package 300B, according to the present embodiment, is similar to the embodiment illustrated in FIGS. 7A and 7B, except that the number of semiconductor chips constituting a stack of the semiconductor chips, and an order thereof to be stacked are changed. Therefore, the description of the embodiment illustrated in FIGS. 1A and 1B, and FIGS. 7A and 7B may be combined with description of the present embodiment, unless otherwise stated.

The semiconductor package 300B, according to the present embodiment, may include two pairs of first to fourth semiconductor chips 100A, 100B, 100C, and 100D, and an uppermost semiconductor chip 100M, according to a shape remaining in a scribe region SL. The shape remaining in the scribe region SL introduced in the first to fourth semiconductor chips 100A, 100B, 100C, and 100D can be understood with reference to the description with reference to FIGS. 3 and 4. For example, as described with reference to FIGS. 3 and 4, the first to fourth semiconductor chips 100A, 100B, 100C, and 100D may be prepared using the presence or absence of the scribe region SL by adjusting a cut line of a wafer 100W1 (FIG. 4) to form the first to fourth semiconductor chips 100A, 100B, 100C, and 100D having different width conditions.

As illustrated in FIGS. 8A and 8B, in the two pairs of first to fourth semiconductor chips 100A, 100B, 100C, and 100D, the first semiconductor chip 100A, the third semiconductor chip 100C, the second semiconductor chip 100B, and the fourth semiconductor chip 100D may be repeatedly stacked twice in this order, unlike the previous embodiment.

FIGS. 8A and 8B illustrate a cross-section of the semiconductor package 300B viewed in the first direction D1, and a cross-section of the semiconductor package 300B viewed in the second direction D2, respectively.

The semiconductor chips 100A, 100B, 100C, 100D, and 100M employed in the present embodiment may have chip regions CA having the same area as each other, and may be stacked in the vertical direction D3 such that the chip regions CA least partially overlap each other. The stack of the semiconductor chips on a base structure 200 may have a side profile having a zigzag-shape due to different widths W1A and W1 or W2B and W2 according to the presence or absence of the scribe region SL.

For example, similar to the previous embodiment, a first side profile (see FIG. 1B) viewed in the first direction D1 may be different from a second side profile (see FIG. 1A) viewed in the second direction D2, perpendicular to the first direction D1. The first and second side profiles, different from each other, may be due to different asymmetric planar shapes of the third semiconductor chip 100C and the fourth semiconductor chip 100D.

For example, referring to FIG. 8A, each of the fourth semiconductor chips 100D has scribe regions SL on both sides thereof in the first direction D1, while each of the second semiconductor chips 100B does not have scribe regions SL on both sides thereof in the first direction D1. Therefore, a first width W1A of each of the fourth semiconductor chips 100D may be greater than a first width W1 of the second semiconductor chip 100B. big. Unlike this, referring to FIG. 8B, since the second and fourth semiconductor chips 100B and 100D do not have scribe regions SL on both sides thereof in the second direction D2, second widths W2 of the second and fourth semiconductor chips 100B and 100D may be substantially the same.

For example, referring to FIG. 8A, since adjacent second and third semiconductor chips 100B and 100C do not have scribe regions SL on both sides thereof in the first direction D1, respectively, first widths W1 of the second and third semiconductor chips 100B and 100C may be substantially the same. Referring to FIG. 8B, the second semiconductor chip 100B might not have the scribe region SL on both sides thereof in the second direction D2, while the third semiconductor chip 100C may have the scribe region SL on both sides thereof in the second direction D2. Therefore, a second width W2B of the third semiconductor chip 100C may be greater than a second width W2 of the second semiconductor chip 100B.

Also, referring to FIG. 8A, the third semiconductor chip 100C might not have the scribe region SL on both sides thereof in the first direction D1, while the first semiconductor chip 100A may have the scribe region SL on both sides thereof in the first direction D1. Therefore, a first width W1A of the first semiconductor chip 100A may be greater than a first width W1 of the third semiconductor chip 100C. Referring to FIG. 8B, since the first and third semiconductor chips 100A and 100C have scribe regions SL on both sides thereof in the first direction D1, respectively, a second width W2B of the first and third semiconductor chips 100A and 100C may be substantially the same.

As such, a first width of one semiconductor chip may be greater than a first width of another semiconductor chip, and a second width of one semiconductor chip may be equal to or smaller than a second width of another semiconductor chip. A second width of one semiconductor chip may be greater than a second width of another semiconductor chip, and a first width of one semiconductor chip may be equal to or smaller than a first width of another semiconductor chip.

This arrangement may distribute stress due to warpage of the base structure 200 having a relatively large area to the upper surfaces of some of the semiconductor chips 100A and 100C, to prevent mechanical damage. As illustrated in FIGS. 8A and 8B, when smile-shaped warpage (e.g., a concave warpage) occurs in the base structure 200, stress SP0 concentrated on the base structure 200 and a lower edge of the stack of the semiconductor chips may be dispersed onto the upper surface of each of the semiconductor chip 100A and 100C having a for example greater than a width of each of the semiconductor chips disposed on each of the semiconductor chip 100A and 100C. For example, stress due to warpage of the base structure 200 may be dispersed onto both side regions SP1 and SP3 of the upper surface of each of the first semiconductor chips 100A, in FIG. 8A, and, onto both side regions SP2 and SP4 of each of the third semiconductor chips 100C, in FIG. 8B.

Figure 9A:
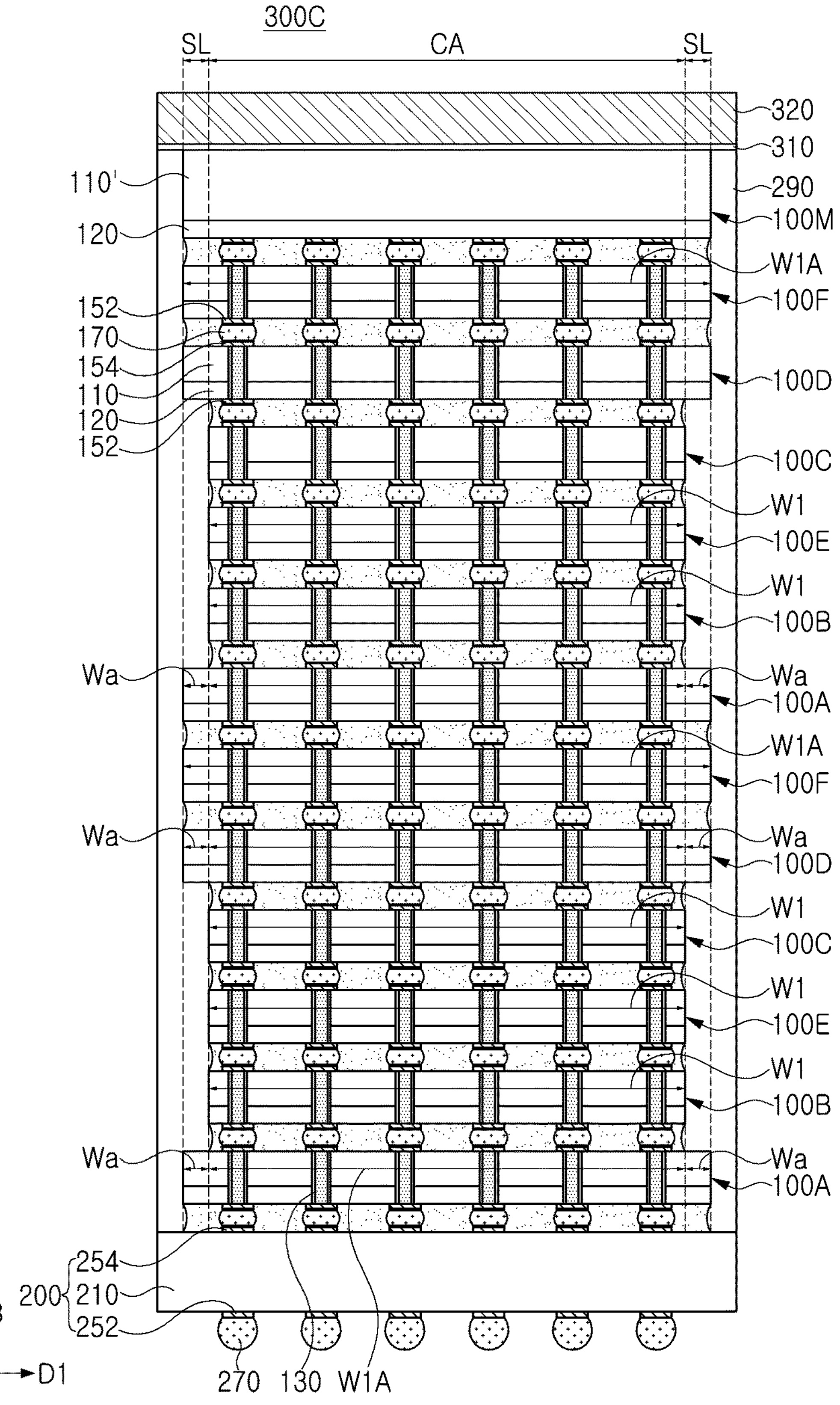
FIGS. 9A and 9B are cross-sectional views of a semiconductor package according to an embodiment of the present disclosure, cut in a first direction D1 and a second direction D2, respectively.
Figure 9B:
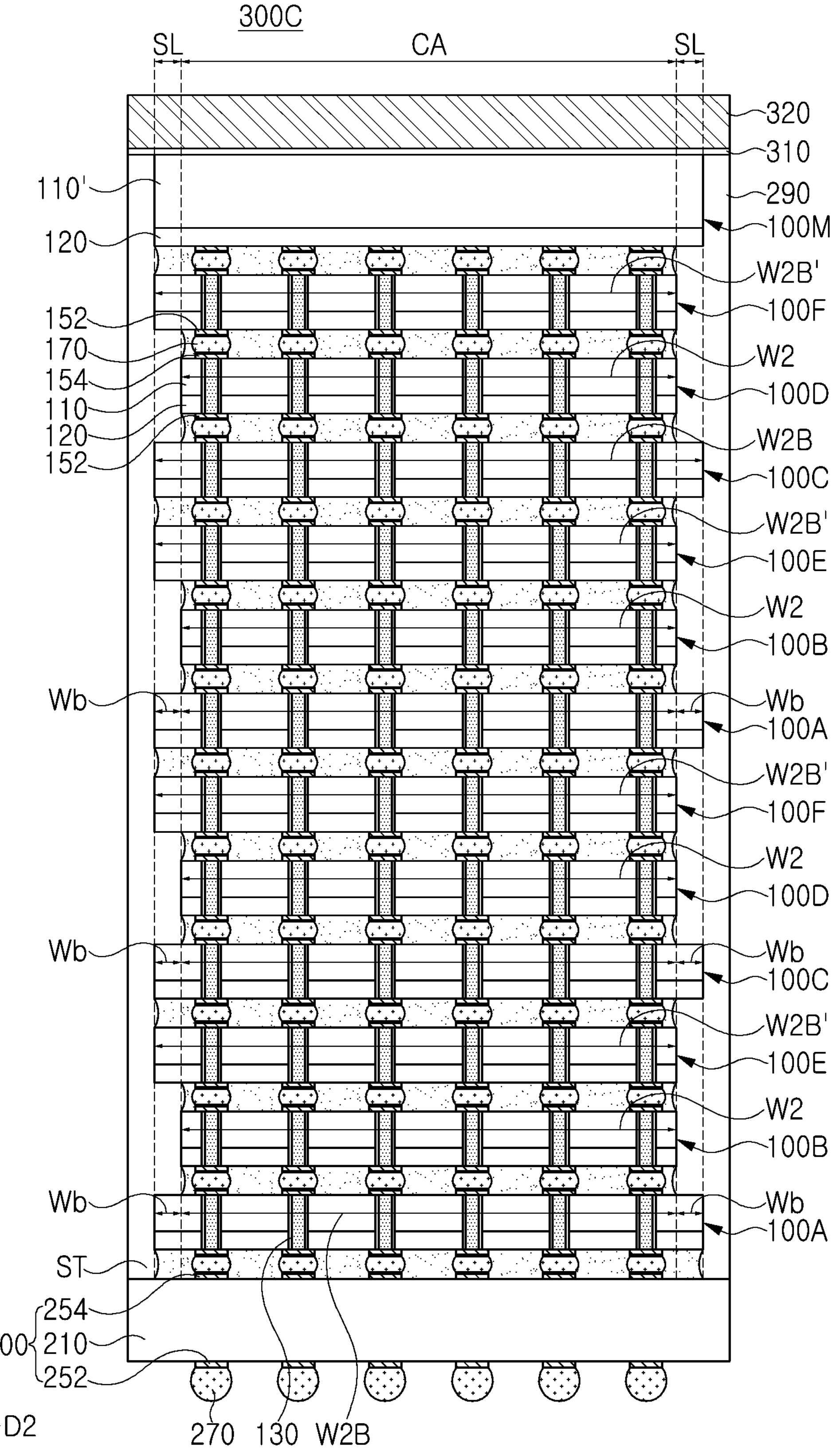

FIGS. 9A and 9B are cross-sectional views of a semiconductor package according to an embodiment of the present disclosure, cut in a first direction D1 and a second direction D2, respectively.

Referring to FIGS. 9A and 9B, it can be understood that a semiconductor package 300C, according to the present embodiment, is similar to the embodiment illustrated in FIGS. 7A and 7B, except that various numbers of semiconductor chips constitute a stack of the semiconductor chips, and an order thereof to be stacked are changed. Therefore, the description of the embodiment illustrated in FIGS. 1A and 1B, 7A and 7B, and 8A and 8B may be combined with description of the present embodiment, unless otherwise stated.

Figure 10:
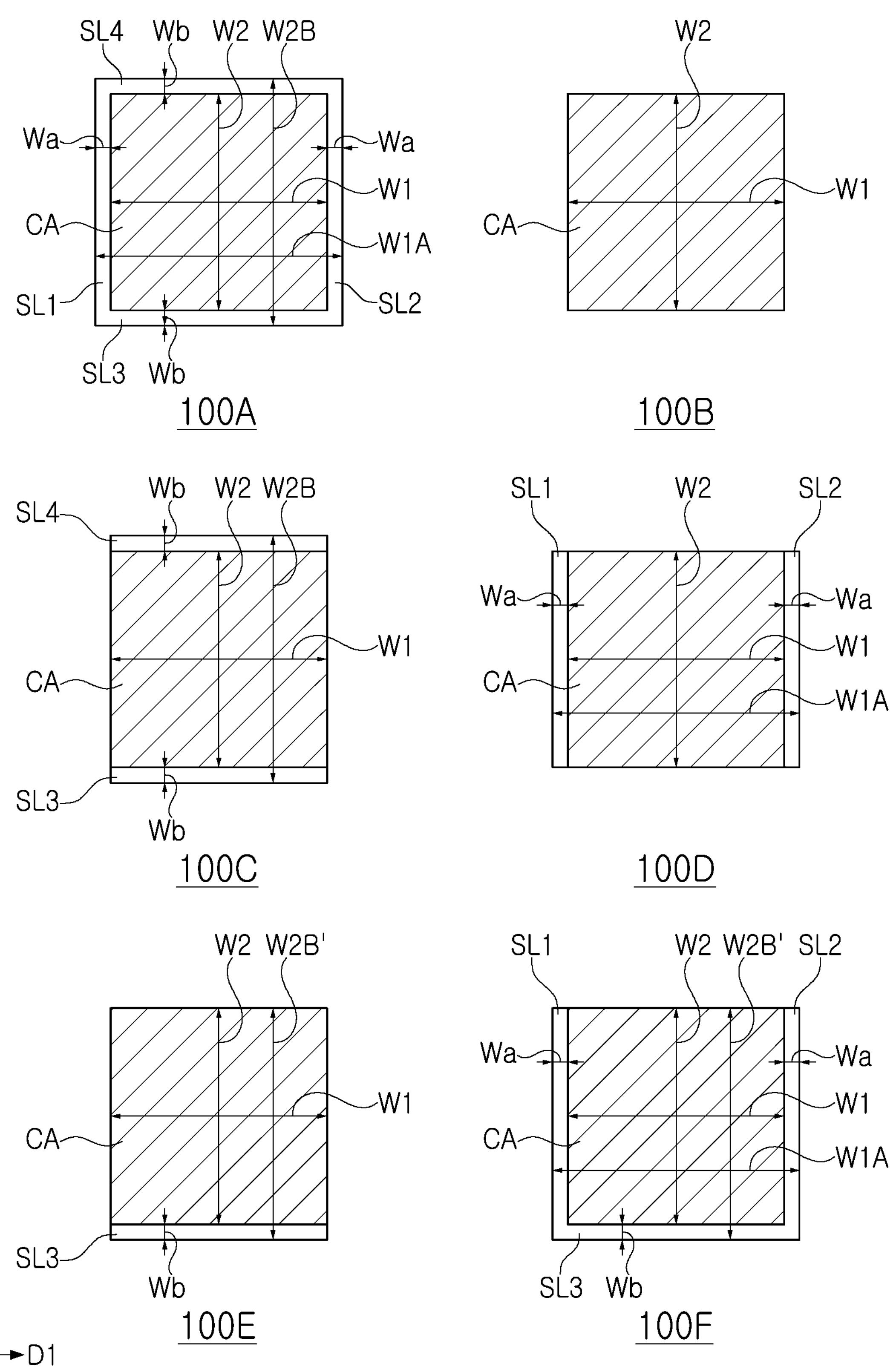
FIG. 10 is plan views of semiconductor chips employed in the semiconductor package of FIGS. 9A and 9B.

The semiconductor package 300C, according to the present embodiment, may include two pairs of first to sixth semiconductor chips 100A, 100B, 100C, 100D, 100E, and 100F, and an uppermost semiconductor chip 100M, according to a shape remaining in a scribe region SL. The shape remaining in the scribe region SL introduced in the first to sixth semiconductor chips 100A, 100B, 100C, 100D, 100E, and 100F may be prepared as illustrated in FIG. 10. In some embodiments, the first to sixth semiconductor chips 100A, 100B, 100C, 100D, 100E, and 100F can be understood with reference to FIGS. 3 and 4 and FIG. 6. For example, the first to fourth semiconductor chips 100A, 100B, 100C, and 100D may be prepared from the wafer 100W1 of FIG. 4, and the fifth and sixth semiconductor chips 100E and 100F may be prepared from the wafer 100W2 of FIG. 6.

Figure 11:
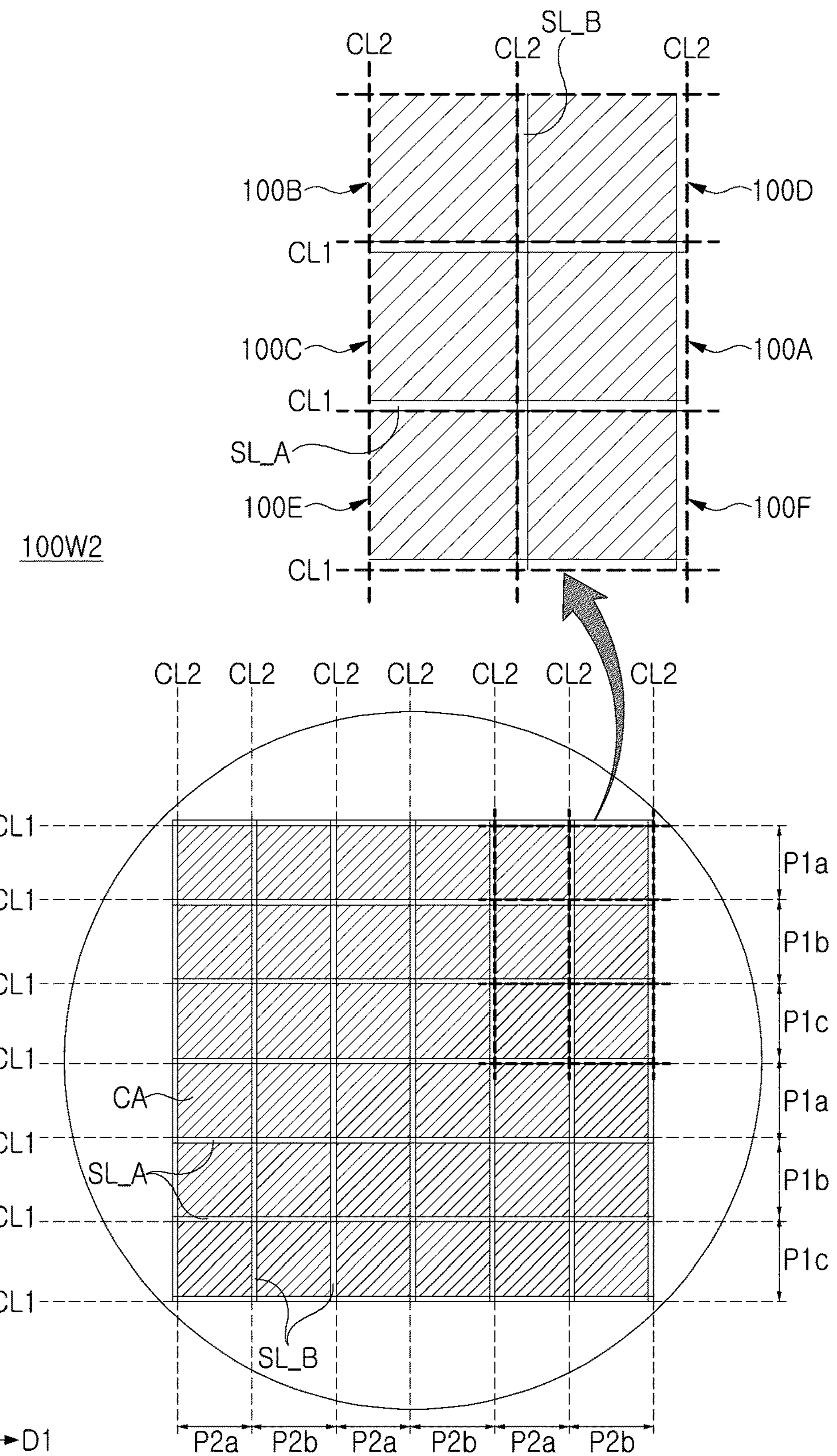
FIG. 11 is a plan view of a wafer illustrating a wafer cutting process for obtaining semiconductor chips employed in the semiconductor package of FIGS. 9A and 9B.

Alternatively, the first to sixth semiconductor chips 100A, 100B, 100C, 100D, 100E, and 100F may be prepared from one wafer 100W2 by adjusting a position of a cut line, as illustrated in FIG. 11. FIG. 11 is a plan view of a wafer 100W2 illustrating a wafer cutting process for obtaining semiconductor chips 100A, 100B, 100C, 100D, 100E, and 100F of FIG. 10.

Referring to FIG. 11, a wafer 100W2 for a plurality of semiconductor chips is illustrated. The wafer 100W2 may include a plurality of chip regions CA arranged in a plurality of rows and a plurality of columns, and first scribe lanes SL_A in the first direction D1 and second scribe lanes SL_B in the second direction D2, between the chip regions CA. Similar to the previous embodiment, each of the first scribe lanes SL_A and the second scribe lanes SL_B may have a constant width.

Positions of cut lines CL1 and CL2 actually cut in the first and second scribe lanes SL_A and SL_B may be adjusted to selectively preserving the scribe lanes around the cut individual chip region CA.

As illustrated in FIG. 11, a first cut line CL1 in the first direction D1 may be repeated at a period of a first pitch P1*a* corresponding to a chip region CA, a second pitch P1*b* corresponding to the chip region CA and two first scribe lanes SL_A, and a third pitch P2*c* corresponding to the chip region CA and one first scribe lane SL_A, and a second cut line CL2 in the second direction D2 may be repeated at a period of a fourth pitch P2*a* corresponding to the chip region CA, and a fifth pitch P2*b* corresponding to the chip region CA and two second scribe lanes SL_B. Widths Wb and Wa of actual remaining scribe regions may be widths excluding a width of a kerf region consumed when cutting in the first and second scribe lanes SL_A and SL_B. The first and second cut lines CL1 and CL2 may be moved at the above-described pitch cycle to perform a smooth cutting process, and as illustrated in the enlarged view of FIG. 11, first to sixth semiconductor chips 100A, 100B, 100C, 100D, 100E, and 100F having different widths, as illustrated in FIG. 10, may be manufactured.

A width of a scribe region in each of the semiconductor chips may be constant by the cut line moved at the above-described pitch period.

For example, referring to FIG. 10, first and second scribe regions SL1 and SL2 of the first, fourth, and sixth semiconductor chips 100A, 100D, and 100F may have substantially the same width Wa as each other. For example, third and fourth scribe regions SL3 and SL4 of the first and third semiconductor chips 100A and 100C may have substantially the same width Wb as each other. The third scribe region SL3 of the fifth and sixth semiconductor chips 100E and 100F may have substantially the same width as the width Wb of the third and fourth scribe regions SL3 and SL4.

As illustrated in FIG. 11, the first to sixth semiconductor chips 100A, 100B, 100C, 100D, 100E, and 100F may adjust a pitch period of the first and second cut lines CL1 and CL2 of the wafer 100W2, to prepare the first to sixth semiconductor chips 100A, 100B, 100C, 100D, 100E, and 100F having different width conditions.

FIGS. 9A and 9B illustrate a cross-section of a semiconductor package 300C according to an embodiment of the present disclosure, viewed in the first direction D1, and a cross-section of the semiconductor package 300B of the semiconductor package 300C viewed in the second direction D2, respectively.

Referring to FIGS. 9A and 9B, two pairs of first to sixth semiconductor chips 100A, 100B, 100C, 100D, 100E, and 100F may include a first semiconductor chip 100A, a second semiconductor chip 100B, a fifth semiconductor chip 100E, a third semiconductor chip 100C, a fourth semiconductor chip 100D, and a sixth semiconductor chip, repeatedly stacked twice in this order.

The semiconductor chips 100A, 100B, 100C, 100D, and 100M employed in the present embodiment may have chip regions CA having the same area as each other, and may be stacked such that the chip regions CA least partially overlap each other in the vertical direction D3. A stack of the semiconductor chips on a base structure 200 may have a side profile having a zigzag-shape of different widths W1A and W1 or W2B and W2, according to the presence or absence of a scribe region SL.

Similar to the previous embodiment, a first side profile (see FIG. 9B) viewed in the first direction D1 may be different from a second side profile (see FIG. 9A) viewed in the second direction D2, perpendicular to the first direction D1. The first and second side profiles, different from each other, may be due to different asymmetric planar shapes of the fifth semiconductor chip 100E and the sixth semiconductor chip 100F as well as the third semiconductor chip 100C and the fourth semiconductor chip 100D.

For example, referring to FIG. 8A, since the sixth and fourth semiconductor chips 100F and 100D have scribe regions SL on both sides thereof in the first direction D1, first widths W1A of the sixth and fourth semiconductor chips 100F and 100D may be substantially the same. Unlike this, referring to FIG. 8B, since the sixth semiconductor chip 100E has the scribe region SL only on one side (left side) thereof in the second direction D2, while the fourth semiconductor chip 100D does not have the scribe region SL on both sides thereof in the second direction D2, a second width W2B' of the sixth semiconductor chip 100E may be greater than a second width W2 of the fourth semiconductor chip 100D.

Also, referring to FIG. 8A, since adjacent third and fifth semiconductor chips 100C and 100E do not have scribe regions SL on both sides thereof in the first direction D1, respectively, first widths W1 of the third and fifth semiconductor chips 100C and 100F may be substantially the same. Referring to FIG. 8B, since the third semiconductor chip 100C has the scribe region SL on both sides thereof in the second direction D2, while the fifth semiconductor chip 100E has the scribe region SL only one side (left side) thereof in the second direction D2, a second width W2B of the third semiconductor chip 100C may be greater a second width W2B' of the fifth semiconductor chip 100E.

In this manner, a first width of one semiconductor chip may be equal to a first width of another semiconductor chip, and a second width of the one semiconductor chip may be greater than a second width of the other semiconductor chip. Also, a width of another semiconductor chip disposed below one semiconductor chip may be arranged to have a for example greater than a width of the one semiconductor chip.

This arrangement may distribute stress due to warpage of the base structure 200 having a relatively large area to the upper surfaces of some of the semiconductor chips 100A and 100C, to prevent mechanical damage.

As illustrated in FIGS. 9A and 9B, when smile-shaped warpage (e.g., a concave warpage) occurs in the base structure 200, stress concentrated on the base structure 200 and a lower edge of the stack of the semiconductor chips may be dispersed onto an upper surface of one semiconductor chip having a for example greater than a width of a semiconductor chip disposed on the one semiconductor chip. For example, stress due to warpage of the base structure 200 may be dispersed onto regions on both sides of the upper surface of the first semiconductor chip 100A in FIG. 9A, and regions on both sides of the upper surface of the first semiconductor chip 100A and regions on both sides of the upper surface of each of the first semiconductor chips 100A and the third semiconductor chip 100C in FIG. 9B, respectively.

In a process of cutting a wafer, semiconductor chips having different widths may be prepared by differently adjusting a scribe lane region (hereinafter, referred to as a "scribe region") remaining in a chip region. Stress generated when a base structure is bent may be dispersed by stacking semiconductor chips having different widths on a base structure having a relatively large area.

While example embodiments have been illustrated and described above, it will be apparent to those skilled in the art that modifications and variations could be made without departing from the scope of the present inventive concept.

What is claimed is:

1. A semiconductor package, comprising:

a base structure having an upper surface; and a plurality of semiconductor chips disposed on a portion of the upper surface of the base structure, each of the plurality of semiconductor chips having a chip region and a plurality of through-electrodes disposed in the chip region, wherein the plurality of semiconductor chips are stacked in a vertical direction such that the chip regions of each of the plurality of semiconductor chips overlap each other, and each of the plurality of semiconductor chips has a first width in a first direction, and a second width in a second direction that is perpendicular to the first direction, and wherein the plurality of semiconductor chips include at least a first semiconductor chip and a second semiconductor chip, each having scribe regions disposed on different sides of each of the chip regions, wherein a first width of the first semiconductor chip is greater than a first width of the second semiconductor chip, and a second width of the first semiconductor chip is equal to or smaller than a second width of the second semiconductor chip.

2. The semiconductor package of claim 1, wherein the stack of the plurality of semiconductor chips has a first side profile in the first direction and a second side profile in the second direction, wherein the first side profile is different from the second side profile.

3. The semiconductor package of claim 1, wherein each of the chip regions of the plurality of semiconductor chips is at least partially surrounded by a first side and a second side that are spaced apart from each other in the first direction, and a third side and a fourth side that are spaced apart from each other in the second direction, and wherein the first semiconductor chip includes a first scribe region and a second scribe region, respectively disposed on the first and second sides of a chip region of the first semiconductor chip, and the second semiconductor chip includes a third scribe region and a fourth scribe region, respectively disposed on the third and fourth sides of a chip region of the second semiconductor chip.

4. The semiconductor package of claim 3, wherein the first and second scribe regions have a same width, and the third and fourth scribe regions have a same width.

5. The semiconductor package of claim 3, wherein the plurality of semiconductor chips further comprise:

a third semiconductor chip having no scribe region proximate to a chip region of the third semiconductor chip; and a fourth semiconductor chip having a peripheral scribe region surrounding first to fourth sides of each of the chip regions of the fourth semiconductor chip.

6. The semiconductor package of claim 5, wherein a lowermost semiconductor chip of the stack is the fourth semiconductor chip.

7. The semiconductor package of claim 5, wherein at least one of the first to fourth semiconductor chips includes two or more integrated circuits.

8. The semiconductor package of claim 5, wherein the plurality of semiconductor chips further comprise:

a fifth semiconductor chip having a fifth scribe region disposed on the fourth side of a chip region of the fifth semiconductor chip; and a sixth semiconductor chip having a sixth scribe region at least partially surrounding the first to third sides of a chip region of the sixth semiconductor chip.

9. The semiconductor package of claim 8, wherein a lowermost semiconductor chip of the stack is the fourth semiconductor chip.

10. The semiconductor package of claim 1, wherein at least one semiconductor chip, among the plurality of semiconductor chips, has a width in the first direction that is smaller than a width in the first direction of a semiconductor chip, of the plurality of semiconductor chips, that is disposed below the at least one semiconductor chip.

11. The semiconductor package of claim 1, wherein at least one semiconductor chip, among the plurality of semiconductor chips, has a width in the second direction that is smaller than a width in the second direction of a semiconductor chip, of the plurality of semiconductor chips, that is disposed below the at least one semiconductor chip.

12. The semiconductor package of claim 1, wherein each of the plurality of semiconductor chips comprises:

a semiconductor substrate having a first surface and a second surface opposite to the first surface;

a device layer disposed on the first surface of the semiconductor substrate and including semiconductor elements;

a first bonding structure having a front surface insulating layer disposed on the device layer, and a plurality of front surface pads electrically connected to the device layer in the front surface insulating layer, the plurality of through-electrodes penetrating the semiconductor substrate and electrically connected to the plurality of front surface pads; and a second bonding structure having a backside insulating layer at least partially covering the second surface of the semiconductor substrate and a plurality of backside pads respectively connected to the plurality of through-electrodes in the backside insulating layer, wherein the second bonding structure of each of the plurality of semiconductor chips is bonded directly to a second bonding structure of another semiconductor chip, of the plurality of semiconductor chips, disposed on a corresponding semiconductor chip.

13. The semiconductor package of claim 1, wherein the base structure comprises a substrate, a base insulating layer disposed on the substrate, and a plurality of connection pads disposed in the base insulating layer, and wherein a front side insulating layer and a plurality of front side pads of the lowermost semiconductor chip, among the plurality of semiconductor chips, are bonded to the base insulating layer and the plurality of connection pads, respectively.

14. The semiconductor package of claim 1, wherein each of the plurality of semiconductor chips comprises:

a semiconductor substrate having a first surface and a second surface opposite to the first surface;

a device layer disposed on the first surface of the semiconductor substrate and including semiconductor elements;

a plurality of front side pads disposed on the device layer and electrically connected to the device layer, the plurality of through-electrodes penetrating the semiconductor substrate and electrically connected to the plurality of front side pads; and a plurality of backside pads disposed on the second surface of the semiconductor substrate and respectively connected to the plurality of through-electrodes, wherein the plurality of backside pads of each of the plurality of semiconductor chips are connected to a plurality of front side pads of other semiconductor chips, disposed on a corresponding semiconductor chip, by conductive bumps.

15. The semiconductor package of claim 1, wherein each of the plurality of semiconductor chips comprises a memory chip, and wherein the semiconductor package is a high bandwidth memory (HBM) device.

16. A semiconductor package, comprising:

a base structure having an upper surface; and a plurality of semiconductor chips disposed on a portion of the upper surface of the base structure, each of the plurality of semiconductor chips having a chip region and a plurality of through-electrodes disposed in the chip region, wherein the plurality of semiconductor chips are stacked in a vertical direction such that the chip regions of each of the plurality of semiconductor chips overlap each other, and each of the chip regions of each of the plurality of semiconductor chips has a first side and a second side, spaced apart from each other in a first direction, and a third side and a fourth side, spaced apart from each other a second direction that is perpendicular to the first direction, and wherein the plurality of semiconductor chips include:

a first semiconductor chip without a scribe region proximate to the chip region thereof, a second semiconductor chip having a first scribe region and a second scribe region, respectively disposed on the first and second sides of the chip region thereof, a third semiconductor chip having a third scribe region and a fourth scribe region, respectively disposed on the third and fourth sides of the chip region thereof, and a fourth semiconductor chip having a scribe region surrounding the first to fourth sides of the chip region thereof.

17. The semiconductor package of claim 16, wherein at least one semiconductor chip, among the plurality of semiconductor chips, has a width in the first direction that is smaller than a width in the first direction of a semiconductor chip of the plurality of semiconductor chips, disposed below the at least one semiconductor chip.

18. The semiconductor package of claim 16, wherein at least one semiconductor chip, among the plurality of semiconductor chips, has a width in the second direction that is smaller than a width in the second direction of a semiconductor chip of the plurality of semiconductor chips, disposed below the at least one semiconductor chip.

19. The semiconductor package of claim 16, wherein the plurality of semiconductor chips further comprise:

a fifth semiconductor chip having a fifth scribe region disposed on the fourth side of the chip region thereof, and a sixth semiconductor chip having a sixth scribe region at least partially surrounding the first to third sides of the chip region thereof.

20. A semiconductor package, comprising:

a lower semiconductor chip having an upper surface; and a plurality of upper semiconductor chips stacked on a region of the upper surface of the lower semiconductor chip in a vertical direction, each of the plurality of upper semiconductor chips having chip regions and through-vias disposed in the chip region, wherein the plurality of upper semiconductor chips are stacked in the vertical direction such that the chip regions of each of the plurality of upper semiconductor chips overlap each other, wherein in a stack of the plurality of upper semiconductor chips, each of the plurality of upper semiconductor chips has a first width in a first direction, and a second width in a second direction that is perpendicular to the first direction, wherein the plurality of semiconductor chips include a first semiconductor chip and a second semiconductor chip, having scribe regions disposed on opposite sides thereof, and wherein a first width of the first semiconductor chip is greater than a first width of the second semiconductor chip, and a second width of the first semiconductor chip is equal to or smaller than a second width of the second semiconductor chip.

* * * * *